United States Patent [19]
Micheli

[11] Patent Number: 5,448,067
[45] Date of Patent: Sep. 5, 1995

[54] TRANSPACITOR

[75] Inventor: Adolph L. Micheli, Mt. Clemens; Joseph V. Mantese, Troy; Norman W. Schubring, Troy; Antonio B. Catalan, Sterling Heights, all of Mich.

[73] Assignee: General Motors Corporation, Detroit, Mich.

[21] Appl. No.: 77,280

[22] Filed: Jun. 17, 1993

Related U.S. Application Data

[62] Division of Ser. No. 699,635, May 16, 1991, Pat. No. 5,272,341.

[51] Int. Cl.$^6$ .............................. G01J 5/20
[52] U.S. Cl. .................................. 250/338.2
[58] Field of Search ............... 250/338.2, 338.3, 338.1

[56] References Cited

U.S. PATENT DOCUMENTS

| | | | |
|---|---|---|---|
| 4,086,124 | 4/1978 | Peuzin et al. | 156/603 |
| 4,916,115 | 4/1990 | Mantese et al. | 505/1 |
| 4,918,051 | 4/1990 | Mantese et al. | 505/1 |
| 4,952,556 | 8/1990 | Mantese et al. | 505/1 |
| 4,962,088 | 10/1990 | Micheli et al. | 505/1 |
| 4,983,577 | 1/1991 | Mantese et al. | 505/1 |
| 5,122,666 | 6/1992 | Turnbull | 250/338.3 |
| 5,272,341 | 12/1993 | Micheli et al. | 250/338.3 |

OTHER PUBLICATIONS

Fukami et al., "Preparation of Stoichiometric KTa$_{1-x}$Nb$_x$O$_3$ Films by RF Sputtering," *Electrical Engineering in Japan*, v 97, n 3, 1977, pp. 12–17.

Mantese et al., "Metalorganic Deposition (MOD): A Nonvacuum, Spin-on, Liquid-Based, Thin Film Method," *Materials Research Society Bulletin*, Oct. 1989, pp. 48–53.

Mantese et al., "Rapid thermal annealing of high T$_c$ superconducting thin films formed by metalorganic deposition," *Applied Physics Letters*, v 52, n 19, 9 May 1988, pp. 1631–1633.

Vest et al., "Synthesis of Metallo-Organic Compounds for MOD Powders and Films," *Materials Research Society Proceedings, Symposium L*:Defect Properties and Processing of High Technology Non-Metallic Materials, Boxton, Mass., Dec. 2–4, 1985, pp. 1–10.

Hulliger et al., "Growth of Monocrystalline Thin Films of Potassium-Tantalate-Niobate (KTN) by Liquid-Phase Epitaxy," *Thin Solid Films*, v 175, 1989, pp. 201–206.

Xu et al., "High KBaTiO$_3$ Films from Metalloorganic Precursors, " *IEEE Transactions on Ultrasonics, Ferroelectrics, and Frequency Control*, v 36, n 3, May 1989, pp. 307–312.

R. K. Willardson and A. C. Beer, Eds., *Semiconductors and Semimetals*, v 5 Infrared Detectors, Academic Press, New York, 1970, Donald Long and Joseph L. Schmit, pp. 175–255.

Franco Jona and G. Shirane, *Ferroelectric Crystals*, Pergamon Press, New York, 1962, pp. 42–44, P. 221, pp. 225–226, and p. 245.

O. M. Stafsudd and M. Y. Pines, "Characteristics of KTN Pyrolectric Detectors," *Jour. Opt. Soc. Amer.*, v 62, n 10, Oct. 1972, pp. 1153–1155.

R. W. Whatmore, P. C. Osbond and N. M. Shorrocks, "Ferroelectric Materials for Thermal IR Detectors," *Ferroelectrics*, v 76, 1987, pp. 351–367.

K. K. Deb, "Pyroelectric Characteristics of a Hot-Pressed Lanthanum-Doped PZT," *Materials Letters*, v 5, n 5–6, May 1987, p. 222.

D. J. Epstein, R. M. Rose, M. MacVicar and R. Lagow, U.S. NTIS, AD Rep., AD-A014996, 1975, pp. 59–64.

A. M. Glass, "Investigation of the Electrical Properties of Sr$_{1-x}$Ba$_x$Nb$_2$O$_6$ with Special Reference to Pyroelectric Detection," *Jour. Appl. Phys.*, v 40, n 12, Nov. 1969, pp. 4699–4713.

(List continued on next page.)

Primary Examiner—Paul M. Dzierzynski
Assistant Examiner—Richard Hanig
Attorney, Agent, or Firm—Cary W. Brooks

[57] ABSTRACT

A film having a unique asymmetrical hysteresis, a method of making, and a method of using such a film in and/or as a device. An example describes a distinctive ferroelectric device as an infrared detector that operates at generally ambient conditions.

30 Claims, 16 Drawing Sheets

OTHER PUBLICATIONS

S. Triebwasser, "Study of Ferroelectric Transitions of Solid-Solution Single Crystals of $KNO_3$-$KTaO_3$," *Phys. Rev.*, v 114, n 1, Apr. 1, 1959, pp. 63–70.

R. K. Willardson and A. C. Beer, Eds., *Semiconductors and Semimetals*, v 5 Infrared Detectors, Academic Press, New York, 1970, E. H. Putley, pp. 259–285.

D. Rytz and H. J. Scheel, "Crystal Growth of $KTa_{1-x}Nb_xO_3$ Solid Solutions by a Slow-Cooling Method," *Jour. Cryst. Growth*, v 59, 1982, pp. 468–484.

Y. Chen, W. D. Kingery and R. J. Stokes, Eds., "Defect Properties and Processing of High-Technology Nonmetallic Materials," *Mat. Res. Soc. Sym. Proc.*, v 60, Dec. 2–4 1985, G. M. Vest and S. Singaram, pp. 35–42 and pp. 1097–1105.

E. M. Levin, C. R. Robbins and H. F. McMurdie, *Phase Diagrams for Ceramists*, The American Ceramic Society, Columbus, Ohio, 1964, p. 160.

R. W. Whatmore, "Pyroelectric devices and materials," *Rep. Prog. Phys.*, v 49, 1986, pp. 1335–1385.

K. L. Chopra, "Thin Film Phenomena," Nucleation, Growth and Structure of Films, Krieger Pub. Co., Malabar, Fl., 1969, p. 183.

W. D. Kingery, H. K. Bowen, D. R. Uhlmann, "Introduction to Ceramics," Grain Growth, Sintering, and Vitrification, John Wiley & Sons, New York, 1960, p. 451.

J. C. Garland and D. B. Tanner, Eds., "Electrical Transport and Optical Properties of Inhomogeneous Media," American Institute of Physics, New York, 1978, p. 16.

B. Jaffe, W. R. Cook, H. Jaffe, "Piezoelectric Ceramics," Acadmic Press, London, 1971, pp. 38–and p. 73.

Robert W. Vest, "Metallo-organic Decomposition (MOD) Processing of Ferroelectric and Electro-Optic Films: A Review," *Ferroelectrics*, v 102, 1990, pp. 53–68.

C. B. Sawyer and C. H. Tower, "Rochelle Salt as a Dielectric," *Phys. Rev.*, v 35, Feb. 1, 1930, pp. 269–273.

M. E. Lines and A. M. Glass, Principles and Applications of Ferroelectrics and Related Materials, Polarization Reversal, Clarendon Press, Oxford, 1977, pp. 103–104 and pp. 112–113.

W. G. Cady, "Rochelle Salt: Dielectric Observations," *Piezoelectricity*, Dover, New York, 1964, pp. 567–571.

A. G. Chynoweth, "Surface Space-Charge Layers in Barium Titanate," *Phys. Rev.*, v 102, n 3, May 1, 1956, pp. 705–714.

S. Jyomura, I. Matsuyama and G. Toda, "Effects of the lapped surface layers on the dielectric properties of ferroelectric ceramics," *Jour. Appl. Phys.*, v 51(11), Nov. 1980, pp. 5838–5844.

Y. Xu, C. J. Chen, R. Xu and J. D. Mackenzie, "The self-biased heterojunction effect of ferroelectric thin film on silicon substrate," *Jour. Appl. Phys.*, v 67(6), 15 Mar. 1990, pp. 2985–2991.

A. B. Catalan et al, "Effects of Annealing Temperature and Annealing Time on Grain Size and Dielectric Constant or Potassium Tantalum Niobate Films", Journal of the American Ceramic Society, 1992.

FIG - 3C $$p\Big]_{\substack{E=0 \\ \text{\& Saturated}}} = \frac{P_{rHI} - P_{rLO}}{T_{HI} - T_{LO}} = \frac{\Delta P_r}{\Delta T} = \frac{\partial P_t}{\partial T}\Big]_E \quad \left(\frac{C}{m^2 \cdot K}\right)$$

Usually $\neq \dfrac{\partial P_s}{\partial T}\Big]_E$ $$p\Big]_{\substack{E=0 \\ \text{\& Unsaturated}}} = \frac{\partial P_r'}{\partial T} \quad \text{\& may} = 0 \text{ if depoled}$$

$$p\Big]_{\substack{E=E1 \\ \text{\& Unsaturated}}} = \frac{\partial P_r'}{\partial T}\Big]_{E1} + \frac{d\left[\underbrace{\dfrac{dP_r'}{dE}\Big]_{E1}}_{\text{Slope}=\epsilon}\right]}{dT} \cdot E1 \neq \text{Energy}$$

$$p\left(\frac{C}{m^2 \cdot K}\right) \quad E\left(\frac{V}{m}\right) = \frac{\text{Joules}}{m^2 \cdot K} = \frac{\text{Energy Density (w)}}{K}$$

FIG - 5  Effective Pyro Coef vs Temp @ 1kHz

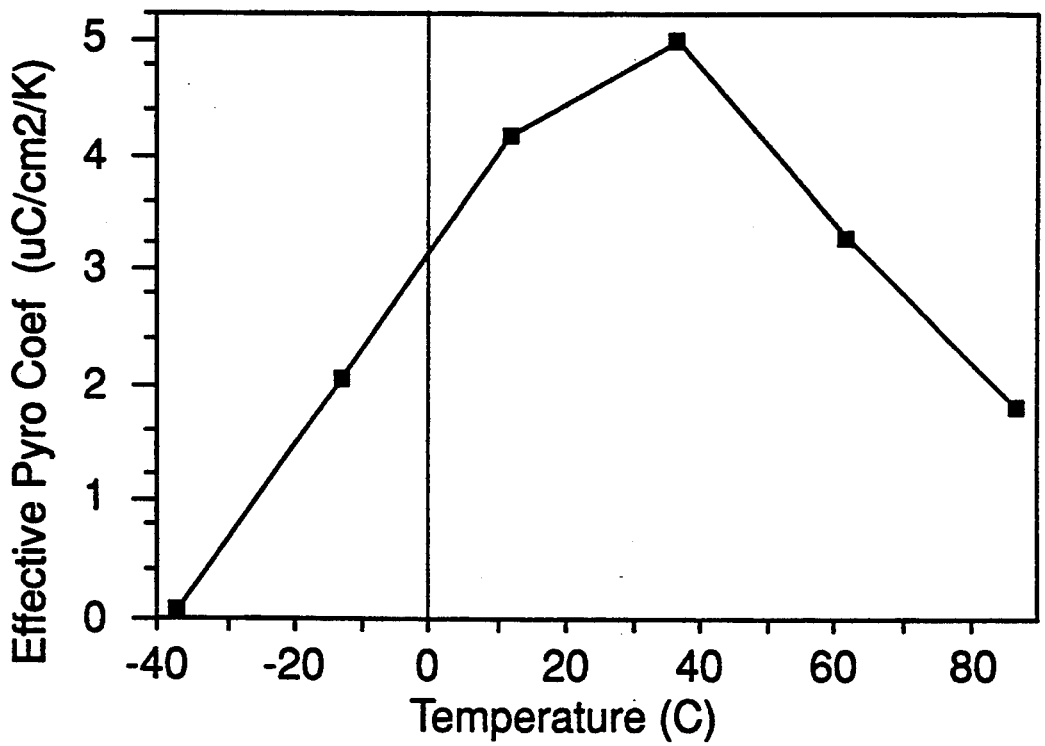

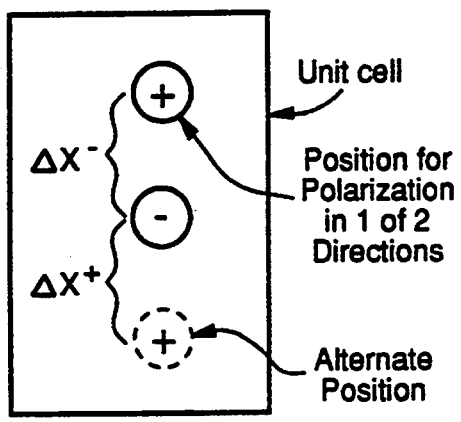
FIG - 17A
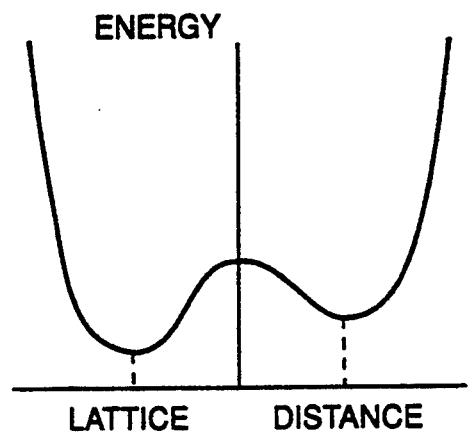
FIG - 17B
FIG - 19
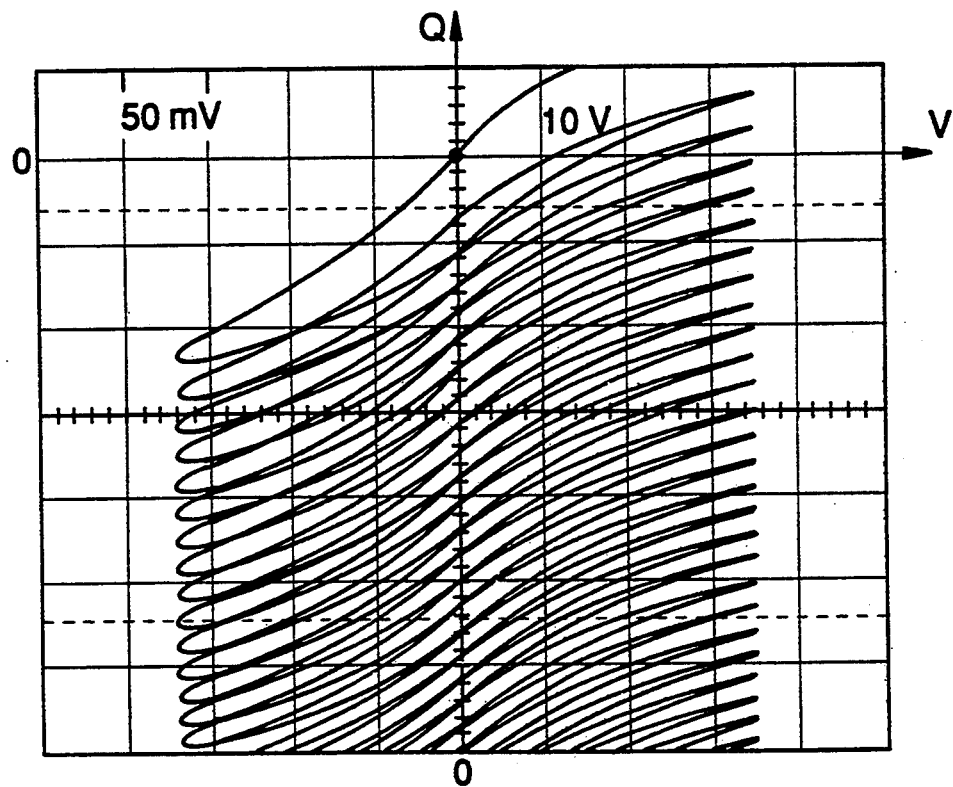

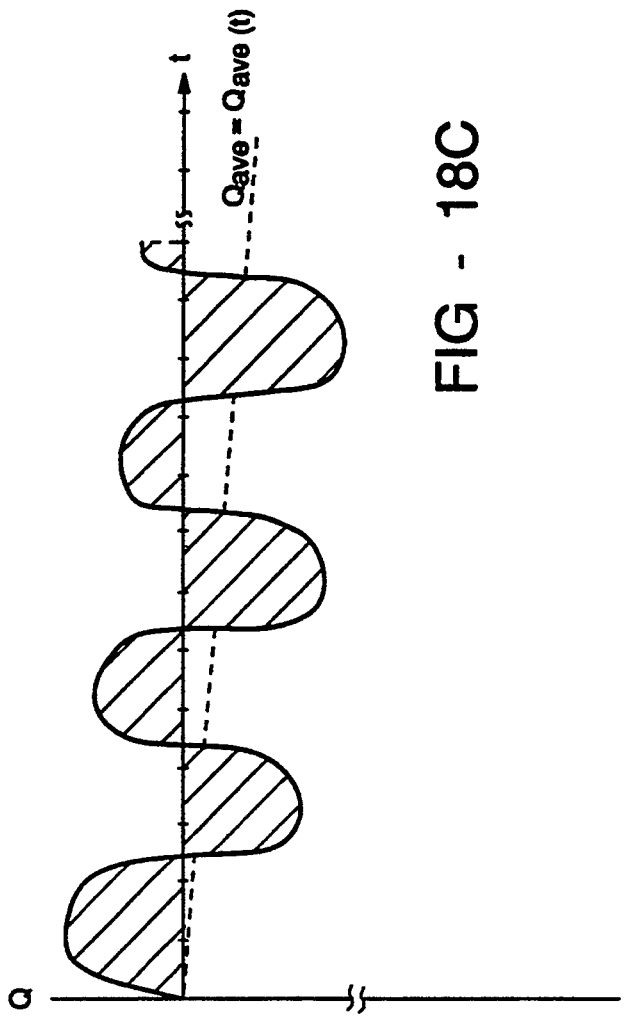
FIG - 18C
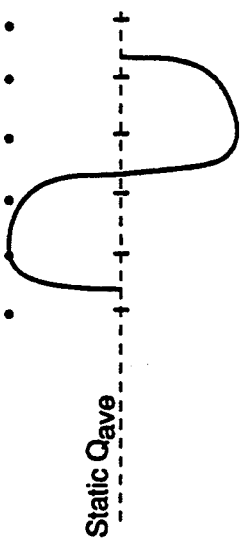
FIG - 18D
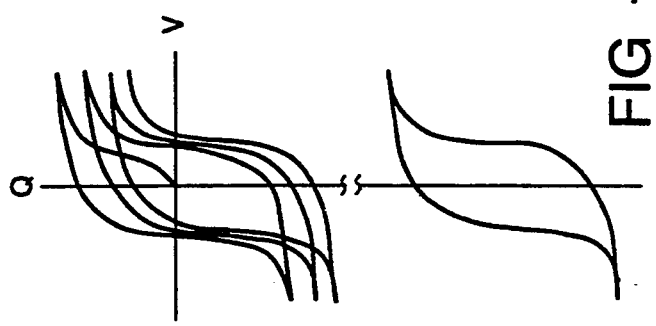
FIG - 18A
FIG - 18B

−50°C

−20°C

10°C

40°C

70°C

100°C

TRANSPACITOR

This is a division of application Ser. No. 07/699635 filed on 16-MAY-1991 now U.S. Pat. No. 5,272,341.

This invention relates to a new type of transducer, to a method of using such a transducer, and to a method of making the transducer. More specifically, this invention relates to a new type of ferroelectric device, to methods of using the ferroelectric device, and to methods of making that ferroelectric device. Because our transducer also acts like a capacitor, we like to refer to it as a "Transpacitor."

BACKGROUND OF THE INVENTION

In our previously filed U.S. Ser. No. 07/533,213, now abandoned we described improvements in ferroelectric materials that are sensitive to infrared radiation. U.S. Ser. No. 07/533,213 specifically discloses ferroelectric polycrystalline potassium tantalate niobate thin films having enhanced pyroelectric effect at ambient temperatures. U.S. Ser. No. 07/533,213 also describes a metallo-organic deposition process for making such films. The films are intended for use in a pyroelectric detector array for a staring-type infrared detector.

In U.S. Ser. No. 07/533,213, we point out that thermal imaging systems have been long used by the military as reliable aids for night vision surveillance. While thermal energies are most often used for night vision enhancement, such systems are also used in fog, haze, rain, and snow. It is, therefore, foreseeable that a vision enhancement system containing a thermal energy system might be useful in automotive applications as an effective driving aid in a variety of driving conditions. However, the vision enhancement system presently used by the military is a relatively expensive and inappropriate system for automotive applications.

Current state-of-the-art military imaging devices make use of various sensor materials and detector geometries. Some of the more successful materials in the past included $Hg_{1-x}Cd_xTe$, $Pb_2Se$ and $PtSi$ schottky diodes. Thermal imaging systems based upon these materials and technology have been demonstrated. Also, the manufacturability of such systems has been proven. However, the primary obstacles for the low-cost production of these vision enhancement systems appear to be the complex infrared (IR) scanning systems and the costly multi-stage cooling systems required to cool the sensing elements to their operating temperatures.

Therefore, it would be desirable to provide an alternative cost-effective detection system which would make use of an array of uncooled or only slightly cooled sensors in a staring-type, rather than scanning, system to detect infrared radiation, preferably in either the 3.5 micrometer or 8-12 micrometer wavelength range. By only slightly cooled, we mean that the sensors need not be maintained at cryogenic temperatures. Previously, the detectors for infrared vision enhancement systems have been primarily made from potassium tantalate niobate, $KTa_{1-x}Mb_xO_3$ (KTN), barium strontium titanate, $Ba_{1-x}Si_xTiO_3$ (BST), and modified lead zirconate titanate $PbZr_{1-x}Ti_xO_3$ (PZT). By "modified" we mean to include lanthanum-doped PZT. These materials are similarly characterized by both the perovskite crystal structure in a large pyroelectric coefficient, making them useful as infrared detector materials.

Both the KTN and BST materials have Curie temperatures which may be varied by appropriately varying the ratios of their chemical constituents. Because of this property, the maximum infrared response (pyroelectric effect) of either KTN or BST may be adjusted to any ambient temperature, making them especially attractive for a high-volume, uncooled, i.e., non-cryogenic infrared detection system. Theoretical calculation based upon their pyroelectric coefficients, emissivities, volume specific heats, and other parameters suggest that the sensitivity of the KTN films should be a factor of about four more sensitive to infrared radiation than the BST films. Therefore, it appears that the use of KTN films is the preferred material for formation of relatively inexpensive, high-volume, uncooled infrared detectors. In the prior U.S. Ser. No. 07/533,213, we focused on KTN. We stated that a typical staring-type infrared detector could be made from an approximately 5 micrometer thick film of KTN having an array thereon of pixels approximately 15 micrometers square. We now believe that the film should be less than 30 microns thick, preferably less than 20 microns thick, and that 10 to 15 microns thick might be the best overall thickness to use. Less than about 5 micrometers thick would make the film too thin for handling purposes, if it is to be separated from the support on which it was formed.

Ideally, the ferroelectric film would preferably be formed from single crystal material for maximum detector response. However, as indicated above, a polycrystalline film may be used if the grain sizes, i.e., the average dimensions of monocrystalline particles, are appropriate. Ordinarily, the monocrystalline particles, i.e., grains, forming the polycrystalline film should at least be about the size of a single domain for the ferroelectric material involved, which in this case is KTN. On the other hand, the grain size in our polycrystalline film should not be so large as to occupy the total thickness of the film. Otherwise, film inhomogeneties, such as porosity, will exist. Accordingly, grain sizes of about the thickness of the film are to be avoided, or significant porosity is likely. Generally, one does not want a grain size that is greater than about one-half the thickness of the film, or porosity may get too high. On the other hand, it appears that in some cases, grain sizes up to two-thirds the thickness of the film might be satisfactory.

One might think that the preferred infrared pyroelectric detector array would consist of reticulated pixels formed on single crystal KTN material that is about 5 micrometers thick. However, this is impractical for high-volume production purposes due to the difficulties in (1) growing chemically uniform single crystals of KTN of sufficient diameter, (2) slicing and thinning the crystals to good parallelism when thinned to dimensions approaching 5-30 micrometers, without degrading crystal quality, and (3) reticulating the film to form the discrete or at least individual pixels. Reticulating the film, i.e., cutting it into individual pixels, is needed if one cannot make the film thin enough. If one can make a very thin film as, for example, less than 20 micrometers, one need not cut the film up. In other words, the pyroelectric effect will be sufficient to show up as a change in capacitance in the array, even though the electrodes are arranged on a continuous film. In this invention, one can easily form such thin films. Even though they use polycrystalline, they are of high quality, rivalling the type of quality achieved with single crystal films after they have been ground down from large thicknesses, and then cut up into discrete pixel areas.

In this connection, thinner is better from a pyroelectric effect standpoint. However, there are handling limitations of about 5 micrometers for our films. Quality in very thin single crystal films may be the limitation in how thin one can go. One has to consider the damage done to the single crystal in the grinding process used to thin a single crystal wafer.

Thus, it appears important that for the economical fabrication of an uncooled, i.e., non-cryogenic, infrared detector having maximum response, one needs a process that will: (1) deposit high-quality thin films of polycrystalline KTN material over relatively broad areas; (2) control the polycrystalline deposition to get monocrystalline grains of appropriate size; (3) obtain chemical, physical, and dimensional uniformity of the films over the dimensions of the detector array; and (4) deposit films of maximum appropriate grain size so as to most closely replicate the properties obtainable with single crystal material. However, in the past, previous attempts to deposit KTN films having these characteristics have proven unsuccessful, such as with the sputter deposition or chemical vapor deposition techniques.

In the prior U.S. Ser. No. 07/533,213, we considered it inventive to recognize that metallo-organic deposition techniques can be used to provide a polycrystalline film that would have the characteristics one desired for infrared detection. It was desired to have a film of uniform stoichiometry, not only across its face, but through its thickness. In our metallo-organic deposition (MOD) technique, a stoichiometric precursor of the desired film is deposited on a substrate, pyrolyzed on the substrate in air to convert the metallo-organic precursors to their stoichiometric constituent oxides, and the pyrolyzed intermediate product annealed to form the perovskite crystal structure throughout the film. We discovered that potassium evaporated from the film during anneal.

An important inventive improvement to the MOD process disclosed in the previously mentioned U.S. Ser. No. 07/533,213 was in starting with a somewhat potassium deficient film (from stoichiometry) at pyrolyzation and in then conducting the KTN anneal in a potassium-rich environment to produce stoichiometry in the annealed film. We believed that this resulted in films having uniform, high-quality physical, chemical, and electrical properties throughout their thickness.

We have now discovered that the films we actually made were slightly more deficient in potassium content (from stoichiometry) than we intended, and that the potassium anneal we described did not, in fact, produce a uniform potassium content through the thickness of the film. Our method, in fact, produced a potassium gradient on the surface of the film exposed to the potassium atmosphere.

In any event, the films we reported in our earlier filed U.S. Ser. No. 07/533,213 had peak dielectric constants ranging between 7,800 to about 11,000 at a Curie temperature of about 9° C. with a corresponding pyroelectric coefficient, $P_f$ equal to about $1.22 \times 10^{-8}$ C/cm$^2$-°C. to about $5.0 \times 10^{-8}$ C/cm$^2$-°C. X-ray diffraction analysis confirmed the presence of the KTN perovskite structure in the films. Scanning electron microscopy revealed grain sizes of the films in the order of about 1–10 micrometers. Film thicknesses up to 30 micrometers were used. The KTN films formed in this manner were used for fabrication of an uncooled infrared detector.

We have now found an even more significant improvement in the manufacture of such films. It appears now that even greater benefits are obtained if the starting film composition is more closely, and preferably exactly, stoichiometric. In such instance, in-diffusion during annealing will make the resultant film, i.e., the annealed film, non-stoichiometric at its surface. It will be potassium-rich at its surface. Moreover, it appears that enhanced infrared detection in a staring-type of infrared detector (over that available from our method as described in our previously filed U.S. Ser. No. 07/533,213) can be realized from the resulting potassium surface gradient. Accordingly, a significant improvement over our teachings in U.S. Ser. No. 07/533,213 has been achieved for a conventional staring-type infrared detector. For example, in our U.S. Ser. No. 07/533,213, we report that a peak dielectric constant ranging between 7,800 to about 11,000 is produced. When the films having a potassium surface gradient over stoichiometry of the form hereinafter described, peak dielectric constants ranging up to 20,000 can be produced. Accordingly, the U.S. Ser. No. 07/533,213 process produces an improvement, but even more of an improvement is obtained if the pyrolyzed film (i.e., the starting film) is stoichiometric to start with, and not potassium deficient. Our currently preferred KTN film is stoichiometric in the majority of its thickness. However, at its surface, there is a higher potassium content that decreases with increasing distance into the thickness of the film. Since the film is on a thick substrate, it is believed that the increased but graded potassium content, over stoichiometry, is not present on the film surface adjacent the substrate. On the other hand, a gradient in potassium deficiency could be present, as will hereinafter be explained.

However, even more importantly, we have discovered that if a KTN film, especially a stoichiometric KTN film, has a graded increase in potassium content approaching its outer surface, the film exhibits an entirely new characteristic not previously recognized for this material. In fact, we believe that this new characteristic was not previously appreciated in any material.

The important new characteristic of our potassium-annealed KTN film is that the film exhibits an asymmetry in electrical characteristics. By this we mean that upon application of an alternating current voltage, the film exhibits a hysteresis. The hysteresis shows a DC voltage shift with increased AC voltage. This indicates that there is a significant charge accumulation occurring on the surface of the film.

In addition, under a constant alternating current voltage, energy input to the film from other sources, such as from infrared sources, also causes a DC voltage shift of the hysteresis. In such instance, under a constant AC potential, energy of one form, i.e., radiant energy, is converted to another form of energy, i.e., electrical charge. When this occurs, the film becomes a transducer. Even more importantly, our calculations and tests thus far indicate that the voltage shift produced by infrared radiation is far greater than the improvement in pyroelectric effect one can observe in a staring-type infrared detector. It appears that this new, i.e., hysteresis, effect can provide a new type of pyroelectric effect that is at least several orders of magnitude more sensitive than what is observed in a staring-type infrared detector formed with this material.

In fact, this graded increase in potassium content at the surface of a stoichiometric KTN film might even provide more startling results in a monocrystalline film of KTN.

In any event, it now appears that polycrystalline KTN films can be used as even more efficient infrared detectors if used in a type of detection system that would detect the hysteresis shift, rather than the capacitance change currently monitored in a staring type of infrared detector.

In addition, it appears that the graded increase in surface potassium content (over stoichiometry in the balance of the film) provides a graded dipole moment. Our studies make us believe that the characteristics inherent to this film would be widely applicable to any ferroelectric film, and perhaps to other materials as well. Not only can such a film be used as an infrared detector, but it can be used as a transducer, and as a rectifier.

It appears that under an AC field of 1–15 KHz, the ferroelectric film of this invention becomes charged on its opposite contact surfaces. It thus forms a unique capacitor. We refer to our new transducer as a transpacitor.

OBJECTS AND SUMMARY OF THE INVENTION

It is an object of the present invention to provide a transpacitor.

It is a further object of the invention to provide methods of using the transpacitor.

A further object of the invention is to provide methods of forming the transpacitor.

Another object is to form potassium tantalate niobate thin films by metallo-organic deposition to have pyroelectric properties that can be used in a number of transducer applications, including thermal imaging for vision enhancement systems (VES).

In accordance with a preferred embodiment of this invention, the above and other objects, features, and advantage of the invention are accomplished as follows.

A stoichiometric thin film of potassium tantalate niobate, $KTa_{1-x}Nb_xO_3$, or KTN, material is deposited using a non-vacuum technique of metallo-organic deposition. The technique is generally as described in U.S. Ser. No. 07/533,213, and is as specifically intended to provide a stoichiometric KTN thin film intended to have a peak dielectric constant at a designated Curie temperature. A stoichiometric metallo-organic precursor of the film is deposited on a suitable substrate, such as platinum or platinum-coated yttria, pyrolyzed in air, and then annealed to form a perovskite crystal structure throughout the film.

During anneal, the film is subjected to a potassium-rich environment. During anneal in the potassium-rich environment, potassium atoms diffuse into the surface of the film to form a graded increase in potassium content adjacent the exposed surface of the film. The potassium concentration gradually increases from stoichiometry as one approaches the outer surface of the film. Since the portion of the film thickness having the potassium gradient is minor, the film is still substantially stoichiometric through its thickness.

KTN films formed in this manner are suitable for the economical fabrication of a non-cryogenically cooled staring-type conventional infrared detector. We have found that the increase in the potassium surface concentration makes the film even better than the film described in U.S. Ser. No. 07/533,213 for such infrared detector applications.

However, even more importantly, we have found that this new type of film has new electrical characteristics that make it suitable for an entirely new system of infrared detection. In the new system, our improved film can have sensitivities at least two orders of magnitude greater than evidenced in the conventional system of the preceding paragraph. It appears to us that sensitivity several orders of magnitude greater may be possible. We believe that the concepts of a graded dipole moment can be applied to a wide variety of materials in addition to KTN.

In addition, it appears that our new material possesses characteristics of transduction not previously available, as for example, rectification and conversion of heat energy to electrical power.

Other objects and advantages of this invention will be better appreciated from the following detailed description and claims.

DESCRIPTION OF THE DRAWING

FIGS. 3a–3c show a ferroelectric capacitor hysteresis loop and mathematical analysis.

FIG. 5 shows a plot illustrating change in effective pyroelectric coefficient with change in temperature.

FIGS. 17a and 17b show diagrams illustrating asymmetry in dipole moment with this invention.

FIGS. 18a–18d diagramatically show a vertically skewed asymmetry in charge vs. voltage provided by this invention.

FIG. 19 shows an oscilloscope screen displaying asymmetry, such as is referred to in FIGS. 18a–18c.

FIG. 23 shows an oscilloscope display illustrating charge out for AC voltage in.

Incorporation by Reference of U.S. Ser. No. 07/533,213

As indicated above, the subject invention is an improvement on our previous invention that is described and claimed in U.S. Ser. No. 07/533,213. All of the relevant disclosure of that previous application is hereby incorporated by reference into the present United States patent application.

DETAILED DESCRIPTION OF THE INVENTION

The pyroelectric KTN films of this invention were prepared by a metallo-organic deposition (MOD) process. The MOD process, per se, is not new. It was used in the prior U.S. Pat. No. 4,962,088 to make superconducting films. U.S. Pat. No. 4,962,088 has overlapping inventorship with this application.

The MOD process fundamentally comprises applying metallo-organic compounds of selected metals on a surface, pyrolyzing the compounds to release the selected metals to form a film, and then annealing the resultant film in air. This invention uses similar steps but they are modified as hereinafter described. For example, this invention comprises spincoating a solution of neodecanoates of potassium, tantalum, and niobium onto an appropriate substrate, thermally decomposing the neodecanoates in air, and then annealing the resultant film in a potassium vapor environment to form an improved pyroelectric KTN film.

For background, we wish to mention that an essential feature of $KTa_{1-x}Nb_xO_3$ is that the paraelectric to ferroelectric transition, i.e., Curie temperature ($T_c$), can be adjusted by varying the composition. The $KTa_{1-x}Nb_xO_3$ is a continuous solid solution of $KTaO_3$ and $KNbO_3$. It is a perovskite $ABO_3$ type with the B site at the center of the oxygen octahedra occupied by either $Ta^{+5}$ or $Nb^{+5}$ ions. The Curie temperature is adjusted by varying the ratio of $Nb^{+5}$ to $Ta^{+5}$. But even though $KTaO_3$ and $KNbO_3$ form a continuous solid solution, they melt incongruently, i.e., the melting does not occur all at once but in discrete compositions. Accordingly, the Curie temperature of a film can vary not only with composition, but with processing temperature. This is well documented in a report by Wrights et al., *Journal of Crystal Growth*, Vol. 59, pp. 468–484 (1982).

Figure 1:
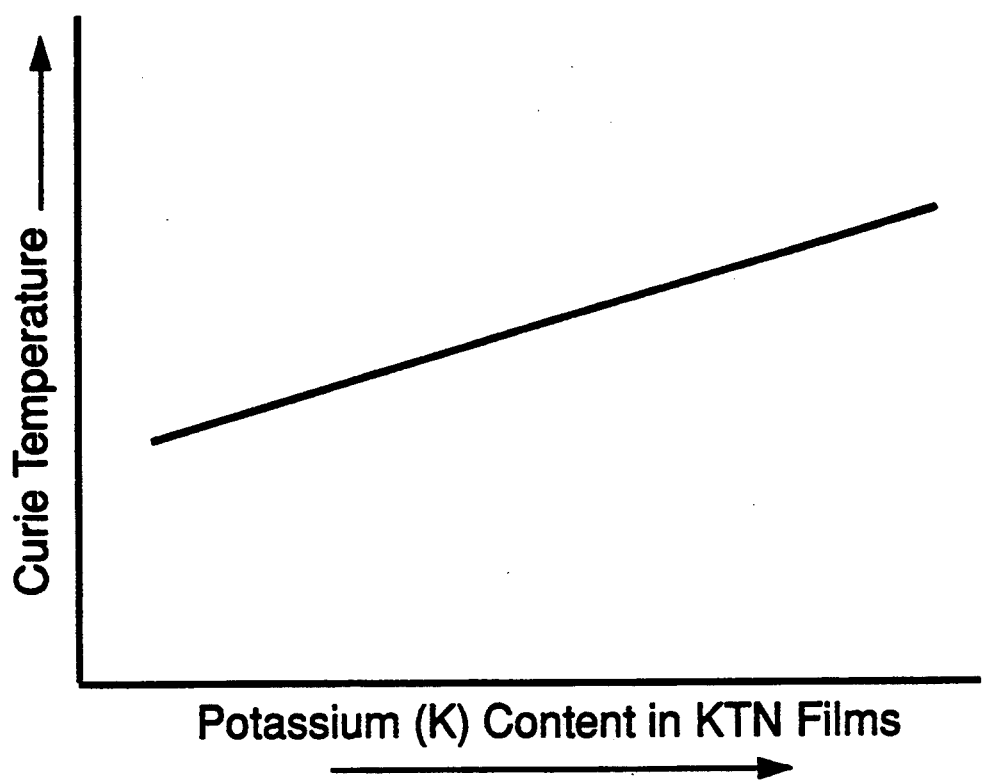
FIG. 1 is a graph showing how Curie temperature increases with increasing potassium content in KTN films.

Since we fire our films below the incongruent melting temperature, variation in composition should not be a factor. However, we have discovered that the potassium vapor anneal of our process produces a gradient in the proportion of potassium in the KTN films. We have recognized that this composition gradient produces a corresponding gradient in Curie temperature in the film. Potassium in the MOD-processed films will first form a $KNbO_3$-rich phase before the equilibrium establishes a $KTa_{x-1}Nb_xO_3$ solid solution. The $KNbO_3$-rich phases have a higher Curie temperature than the $KTaO_3$-rich phases. The shift in Curie temperature with potassium (K) content is shown in FIG. 1.

Figure 2:
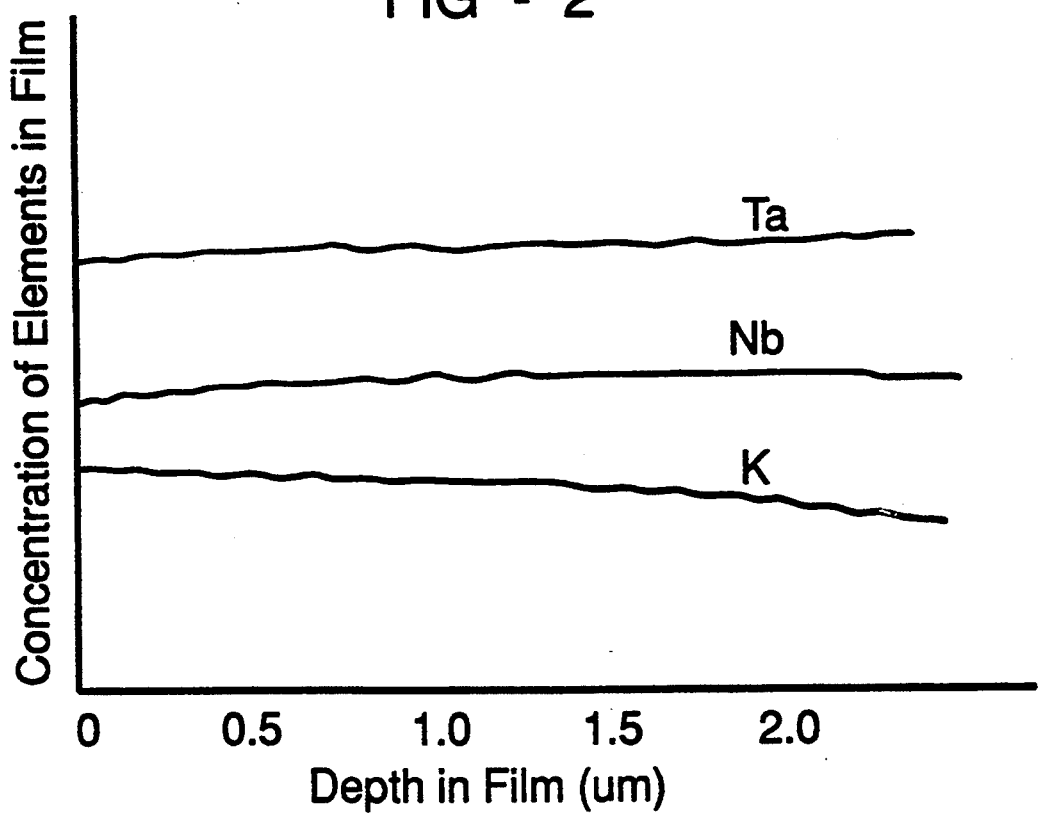
FIG. 2 is a graph showing potassium surface concentration decreases with increasing depth into a KTN film of this invention.

As hereinbefore indicated, we originally intended to prepare our films by making the inks purposely potassium (K) deficient, and then firing them in a potassium atmosphere to make up the potassium deficiency. In terms of total film thickness, this technique was intended to result in an average stoichiometry. Unfortunately, we have found that this process does not, in fact, produce homogeneous stoichiometry through the thickness of the film. Instead, it forms a potassium gradient adjacent the outer surface of the film, because potassium diffuses so slowly at our firing conditions. In other words, complete equilibrium with potassium through the entire thickness of the film does not occur with our processing parameters. The presence of the potassium concentration gradient through the film thickness is confirmed by XPS analysis, the results of which are shown in FIG. 2. In the KTN system, this graded composition not only forms a graded Curie temperature ($T_c$) in the relevant thickness of the film, but also forms a polarization gradation through that thickness of the film. In other words, there is a graded dipole moment perpendicular to film thickness adjacent that one surface. One can visualize that the gradation is in a series of planes parallel to that one surface, in which each plane has a lower Curie temperature than the one above it.

It may be that a graded dipole moment forms an unbalanced capacitance switch. In any event, the result is that an unbalanced capacitance switch is formed that delivers an unbalanced charge wave form from a symmetrical cyclic excitation. This effect is new. One benefit is that there is a much higher enhancement of the pyroelectric effect for thermal imaging.

We also tend to visualize the foregoing effect, i.e., the effect produced by the potassium gradation, as graded "junctions" that are adjacent one face of the film. Graded "junctions," i.e. dipole moments, in KTN can be formed in ways other than as described above. Since Curie temperature is a function of tantalum to niobium ratio, this ratio can be purposely graded throughout the film keeping the potassium concentration a constant. In this manner, Curie temperatures from approximately 435° C. (no tantalum) to approximately −272° C. (no niobium) can be formed. As mentioned above, such a graded "junction" will produce a graded polarization at any temperature. Graded "junctions" are not the sole property of KTN or the perovskites. Such "junctions" can clearly be formed from other perovskites, such as lead-barium titanate (PBT). Adjustment of the lead or barium concentration in such materials should be equivalent to variations in potassium and tantalum, respectively, in KTN. We would expect that this type of graded "junction" can be formed in many, if not all, perovskites.

Graded "junctions," i.e., dipole moments, may also be formed by variation in the amount of disorder in the films. Imperfections purposely placed in the films will change the polarization. Accordingly, "junctions" graded in polarization but not in Curie temperature can result.

Graded "junctions" can thus be formed in a large number of ways, not only in KTN, but in a large number of ferroelectrics. They could be formed by chemical vapor deposition (CVD) with a variation in the concentration of potassium, tantalum, or niobium. Graded "junctions" could be formed by implantation to (1) introduce damage to the film, or (2) to dope the film. The graded "junctions" could be formed by sputtering, or any of the conventional thin film deposition methods. Alternatively, a graded "junction" may be produced by forming a uniform film, and then selectively volatilizing or removing a specific species from the film. For example, the annealing of a KTN or PBT film in oxygen will produce surfaces which are potassium and lead poor, respectively. The degree of grading will, of course, be influenced by both the time and the temperature.

Analogously, the graded "junction" concept should be applicable to single crystal material, as well as to polycrystalline material. Still further, it should be applicable to a wide variety of materials, not just infrared detecting materials on which we focus in this disclosure. It clearly should be applicable to the KTN, BST and PZT infrared materials but also to $Hg_{1-x}Cd_xTe$ and $PB_2Se$ infrared detecting materials. Still further, it is conceivable that one might find even better graded Curie temperature devices through the use of heterojunctions.

The films themselves can be formed by a process analogous to that described in the previously filed U.S. Ser. No. 07/533,213 or by any other process that will form the dipole gradient, i.e., graded junction.

Our process is intended to form films that can be separated from a substrate, and then attached to an LSI silicon integrated circuit for use as an infrared detector. We will be describing that technique in one or more patent applications soon to be filed. In that use, the film is a self-supporting element bonded to the LSI IC at a plurality of points. To serve its function, the film has to be selectively metallized. Accordingly, it has to be essentially crack-free, i.e., non-porous, to be useful. Otherwise, metal can penetrate the film to produce an electrical short between opposite faces of the film.

Thin films of KTN can be formed on a 10 mil thick platinum foil or on a platinum-coated yttria substrate by metalorganic deposition techniques. On the latter substrate, the platinum coating can be about 1 micrometer thick. This method generally consists of the steps of: (1) flooding the surface of a suitable substrate, such as platinum, with metal carboxylates dissolved in xylene, (2) spinning the substrates at a high rate of speed to uniformly coat the platinum with the organic solution and drive off the xylene, (3) pyrolyzing the organic material to convert the carboxylates to their metal oxides, and (4) annealing the films to form the perovskite crystal structure essentially throughout the films.

The preferred potassium tantalum niobate, $KTa_{0.6}Nb_{0.4}O_3$, or KTN, films were prepared by first synthesizing appropriate metalorganic precursors from the carboxylates of the metals. Carboxylates refer to the metalorganic precursor formed by the bonding of a metal ion to a carboxylic acid. Although the carboxylates are preferred because they form superior films, other metalorganic compounds may be utilized. Specifically, tantalum and niobium compounds were prepared by reacting their ethoxides with neodecanoic acid to form the diethoxide trineodecanoates having the corresponding formulas $Ta(C_{10}H_{19}O_2)_3(C_2H_5O)_2$ and $Nb(C_{10}H_{19}O_2)_3(C_2H_5O)_2$. The potassium compound was formed by reacting potassium hydroxide in methanol with neodecanoic acid to form potassium neodecanoate ($KC_{10}H_{19}O_2$). These metalorganics were dissolved in xylene at a preferred ratio of about 1 milliliter of solvent to about 1 gram of compound to form the desired KTN metalorganic solution.

The composition of the metalorganic solution was adjusted to obtain a film with a Curie temperature near room temperature. The Curie temperature is the temperature at which the transition between a ferroelectric and nonferroelectric phase occurs. For KTN material, the Curie temperature may be varied by adjusting the tantalum (Ta) to niobium (Nb) ratio. For KTN, its dielectric constant and pyroelectric coefficient peaks at the Curie temperature making KTN especially useful for IR detection.

If one wants to form a film by our technique on an yttria substrate, we prefer that the film be initially platinum coated. Also, the film has to be close to stoichiometry when it is pyrolyzed. The preferred solution of neodecanoates disclosed in U.S. Ser. No. 07/533,213 will not provide stoichiometry. In order to obtain it, to provide a Curie temperature near room temperature, the following composition should be used:

tantalum diethoxide tri-neodecanoate = 25 g
niobium diethoxide tri-neodecanoate = 16 g
potassium neodecanoate = 15 g
xylene = 57 ml The tri-neodecanoates were dissolved in the xylene and then dispensed onto a substrate much like photoresist is dispensed. The substrate, preferably platinum-coated yttria, or platinum, is spun at a few thousand revolutions per minute (rpm). A drop of the above-mentioned solution of tri-neodecanoates is dispensed at the center of the spinning surface. After a predetermined period, a uniform metallo-organic film is obtained on the surface. At several thousand revolutions per minute, a film only a few microns thick is obtained. If the substrate is spun at a lesser number of revolutions per minute, a thicker film can be obtained. Other suitable substrates might be used. Perhaps platinum-coated $CaF_2$, $BaF_2$, and $Er_2O_3$ might be useful. The substrate is spun generally for about 20 seconds to obtain uniform coating thickness. It would appear that spinning the substrate for a longer period of time is unnecessary.

The soft metallo-organic film is then pyrolyzed to convert the metallo-organic precursors to their constituent oxides. The film is pyrolyzed by placing the tri-neodecanoate coated substrate into a furnace preset at 600° C. that has an air atmosphere. While we use a pyrolysis temperature of 600° C., we expect that temperatures of about 500° C.–700° C. can be used, with correspondingly altered soak times at temperature. The duration of pyrolysis at this temperature is about one to five minutes, preferably four or five. This will ensure complete pyrolyzation of the metallo-organics into their respective metal oxides. The film thickness after pyrolysis is approximately 0.2 microns per spin cycle. Under such conditions, repeated coatings of the metallo-organic solution are obviously necessary to build up film thicknesses of 5–30 micrometers. Using fewer revolutions per minute during the film coating cycle, or starting slowly and building up to 2000 rpm, can also be used to provide individually thicker films, after pyrolysis, per coating cycle. In such instance, fewer spin-pyrolyzation steps need be repeated to obtain the desired resultant film thickness.

Previously, we thought that the amount of potassium in the KTN metallo-organic solution should be about 20 percent lower than the stoichiometric amount. Now, we believe that it should be precisely at the stoichiometric amount in order to obtain the benefits of this invention. In this way, when the film is annealed in a potassium-rich atmosphere, a resultant graded potassium content, over stoichiometry, is obtained on the surface of the film.

After pyrolysis, the films were characterized by an amorphous pattern, as confirmed by X-ray analysis. Dielectric properties of the film are grain-size dependent. The X-ray analysis indicated KTN peaks. Accordingly, based on theoretical calculations and confirmed by empirical analysis, continuous KTN films having grain sizes of the order of 5 micrometers are preferred. In general, permittivity increases with grain size, but so does the tendency for porosity. Since porosity on even a micro scale can reduce effective permittivity, one must balance the two effects to obtain optimum grain size for a given film thickness. As previously indicated, one desires to have a grain size at least as large as the KTN ferroelectric domain size, and preferably larger. On the other hand, one does not want the grains larger than 50 percent of the thickness of the film, if optimum permittivity is to be obtained. Generally, grain sizes of the order of 5–10 micrometers for a 10–12 micrometer film are desirable. In order to obtain grain growth to this desired grain size, the films were annealed in a potassium atmosphere between about 1100° C. to about 1250° C. for a duration of about ten minutes to one hour. More specifically, annealing in the potassium-rich atmosphere can be done at a temperature of about 1050° C. to about 1250° C., preferably about 1150° C., for up to about an hour or so. At the preferred temperature, annealing for preferably about 12 to 18 minutes in a potassium-rich atmosphere in a closed platinum crucible placed on a zirconia setter is preferred. At 1100° C., twenty-four minutes is preferred.

In our tests, we prefer that the crucible be surrounded by, but not touched by, the source of potassium. We are not sure such care is, in fact, needed, but we know it works. The source of potassium is a compound composed of potassium and alumina. About one mole of potassium oxide ($K_2O$) to about 11 moles of aluminum oxide ($Al_2O_3$) has been successfully used. This amounts to about 11 percent by weight potassium oxide. However, we now prefer a potassium aluminate mixture that has 20 percent by weight potassium. After heating the films in an air furnace for preferably about 12 to 18 minutes at about 1150° C. in the presence of this potassium-aluminate compound, X-ray analysis indicated clean KTN peaks with no additional phases present. Anneal at 1100° C. for 24 minutes has also been used, after pyrolyzation at 600° C. for 300 seconds.

It has been found that an addition of 75 parts per million iron, added as iron neodecanoate to the original organo-metallic mixture, gives best results on permittivity if this film is going to be used in a staring-type infrared detector contemplated in our earlier U.S. Ser. No. 07/533,213. It does not appear that the addition of such a small impurity amount enhances or detracts from the unique effect on hysteresis described and claimed herein. In fact, it appears that a hysteresis loop exists up to about 100° C. above the Curie temperature of this material, with or without the iron impurity addition.

After anneal in the air atmosphere rich in potassium vapor, we prefer to bake the film at 900° C. for one hour in oxygen. This seems to assure acquisition of the highest permittivity values, perhaps because it assures complete oxidation of the metals in the film. At 900° C. little out-diffusion of potassium occurs. Hence, an air or oxygen atmosphere can be used without need for suppressing potassium outdiffusion. On the other hand, we recognize that some potassium could be diffusing out at 900° C. Perhaps at a later date we can run tests to see if suppressing it is worth the effort. We believe this bake should be at a temperature high enough to assure oxidation but not high enough to significantly out-diffuse potassium.

In our prior U.S. Ser. No. 07/533,213, dielectric measurements taken after the potassium addition to the films revealed dielectric constants at the Curie temperature between about 2000 and 7800, depending on the firing conditions. With our improved composition, we obtain dielectric constants up to 20,000, particularly when about 75 parts per million iron are present. However, if the films are too thin, they will have discontinuities along their surface, which permits shorting of electrodes placed on opposite faces of the film. Multi-layers of the metallo-organic KTN solution can be spun on and individually pyrolyzed to form the resultant desired thickness. Such multi-layers tend to prevent such discontinuities, especially if ten to forty layers are used. The platinum surface below the film was used as a lower electrode. A circular, dual-layer electrode of an area of about 0.0123 $cm^2$ was formed by e-beam evaporation. The first layer (the underlayer) deposited was a chrome layer about 40 nanometers thick. The second, or outer layer, was a gold layer about 300 nanometers thick. The gold could be up to 1–2 micrometers thick. Titanium-nickel electrodes could also be used. Substitution of the Au/Cr and platinum electrode by other metals such as indium, chrome, copper or aluminum did not significantly alter results in our testing.

The dielectric constant, $\kappa$, is a function of temperature for KTN films having various tantalum to niobium ratios and which have been processed under a variety of conditions. It was determined that as the ratio of tantalum to niobium increased, this generally resulted in materials with lower Curie temperatures, $T_c$. In addition, increasing the annealing temperature resulted in increased grain size within the films which simultaneously increased the Curie temperature and, up to a point, the dielectric constant of the thin film material. For practical reasons, the preferred ratio of tantalum to niobium varies between about 2.29 to about 1.43, resulting in a corresponding shift in the Curie temperature of about 100° C. from −50° C. to about 50° C.

Selection of a tantalum to niobium ratio is not the only parameter selected for obtaining a particular Curie temperature. Varying the annealing temperature from about 950° C. to about 1250° C. shifts the Curie temperature by about 35° C., when the tantalum to niobium ratio is about 1.77. As the Curie temperature increases, the dielectric constant, $\kappa$, rises from about 3000 to 7800. Using this technique, a Curie temperature of about 9° C. was obtained for the thin film KTN material having a tantalum to niobium ratio of about 1.77. These results agree with previous work done on bulk single crystal KTN material.

Scanning micrographs revealed that the grain sizes for films annealed at about 1180° C. and about 1250° C., with the tantalum to niobium ratio being about 1.77 in both instances, are approximately 1–2 micrometers and approximately 5–10 micrometers, respectively. The larger grain size is preferred since it is characterized by properties more similar to a single crystal film; therefore, annealing at about 1250° C. may be preferred for some applications, probably for thicker films. Annealing the materials much in excess of about 1250° C. is not desired, when the tantalum to niobium ratio is about 1.77, because it will lead to the formation of a liquid phase. Since melting tends to lead to the formation of multi-phase materials, none of the samples was annealed to temperatures greater than about 1250° C.

X-ray diffraction confirms the formation of single phase KTN material after annealing in a potassium-rich atmosphere at temperatures of about 1100° C.–1250° C. The X-ray diffraction pattern for a powdered single crystal KTN sample having a tantalum to niobium ratio of about 1.5 was compared to the X-ray diffraction pattern for a KTN thin film on a platinum substrate annealed at 1200° C. in air and subsequently annealed in air rich in potassium vapor, with the tantalum to niobium ratio equal to about 1.77. For both X-ray diffraction patterns, copper K$\alpha$ radiation was used. Except for some platinum peaks due to the underlying substrate, X-ray diffraction analyses indicate that only the KTN phase is present and it is structurally equivalent to the powdered single crystal KTN material.

Pyroelectric coefficients for the preferred KTN films wherein the tantalum to niobium ratio equals about 1.77 and the dielectric constant equals about 7800 are reduced compared to that of those values for single crystal material. Near the Curie temperatures, the dielectric constant $\kappa$ varies much more rapidly and attained a much larger value for the single crystal material as compared to the films formed in accordance with our method. It was determined that the pyroelectric coefficient for the bulk single crystal material was equal to about $8.3 \times 10^{-8}$ C/cm$^2$-°C. at a temperature of about 3° C. and a microscopic electric field of about 1.0 kV/cm. The pyroelectric coefficient for the films formed in accordance with our invention is up to about $5.0 \times 10^{-8}$ C/cm$^2$-°C. at a temperature of about 37° C. and a microscopic electric field of about 2.5 kV/cm. We have even achieved pyroelectric coefficients of $2 \times 10^{-5}$ C/cm$^2$-°C.

This invention readily facilitates the formation of high quality KTN films for infrared wavelength detection purposes. While our invention has been described in terms of preferred embodiments, it is apparent that other forms could be adopted by one skilled in the art, such as by modifying the precursor metalorganic materials or the processing parameters. For example, this disclosure is not intended to preclude the addition of elements to the film composition that do not prevent formation of the novel characteristics of the films disclosed herein.

In order to describe the anomalous pyroelectric effect associated with specially processed ferroelectrics as hereinbefore described, it is necessary to first describe the conventional pyroelectric effect. The conventional pyroelectric effect coefficient p, in coulombs per meter$^2$ per Kelvin (C/m$^2$·K), is derived in FIG. 3 by direct inspection of the ferroelectric hysteresis loop, as opposed to either the speculative mathematical manipulation of electromagnetic field equations that may or may not be appropriate to the macroscopic situation, or to the hypothesized atomic behavior in the microscopic crystalline structure.

Figure 3A:
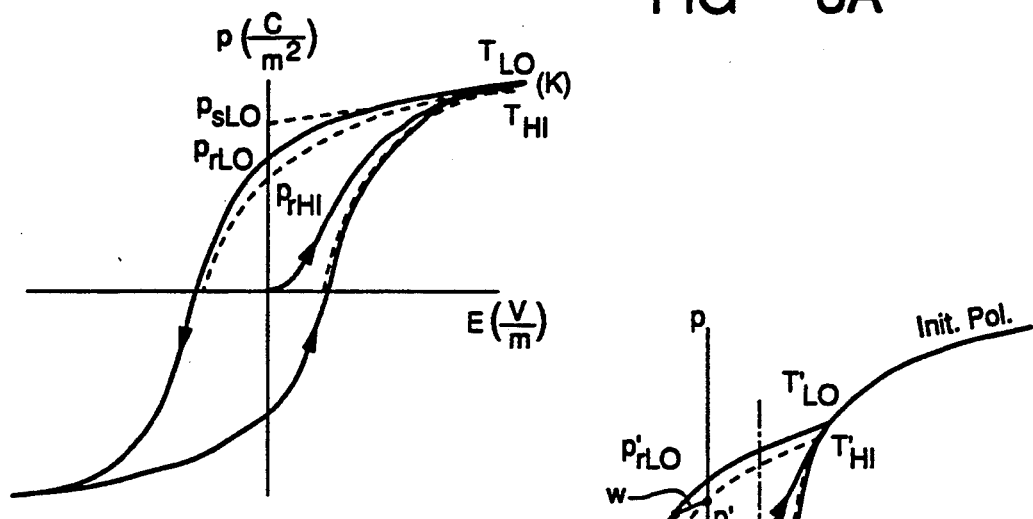
Figure 3B:
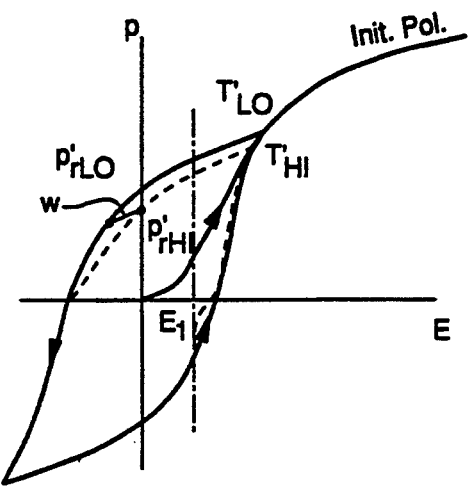

A ferroelectric capacitor demonstrates a hysteresis loop during a cyclic plot of charge versus voltage. In FIG. 3, the plot is made to be independent of any particular capacitor geometry by plotting polarization P (C/m$^2$·K)) versus electric field E (V/m). At the upper left of FIG. 3, a typical hysteresis loop at temperature $T_{Lo}$(K), in a fully saturated state, is shown. Extrapolation of the saturated region back to the y-axis defines the idealized spontaneous polarization $P_s$. But generally, the actual residual polarization $P_r$ is somewhat less than $P_s$. The dashed line portion of a second hysteresis loop at temperature $T_{Hi}$(K), shows the change in $P_r$ associated with this temperature change. The direct and logical expression for the pyroelectric coefficient p at zero field and following full saturation is shown in the figure.

However, for the unsaturated excursion at the upper right of FIG. 3, the coefficient is reduced, and in the limit becomes zero for a fully depoled (i.e., equivalent to degaussing in magnetics) specimen.

In the most general case, the ferroelectric may be held at some bias field $E_1$ as shown, and then the temperature allowed to change. The slope anywhere on the P vs E characteristic is essentially the permittivity $\epsilon$. The derivative $d\epsilon/dT$ times E, is the conventional second term of the expression for pyroelectric coefficient.

It should be recognized that p does not have units of energy and, as such, really does little to describe the strength of a pyroelectric material. But p times E represents energy density per Kelvin. The actual accuracy and value of the accepted general expression for the pyroelectric coefficient is, therefore, somewhat misleading. Nevertheless, since the traditional pyroelectric effect is basically the change in the charge state of the matter, with a change in temperature, the only truly valid pyroelectric coefficient expression is, in terms of displacement D, $$p = \delta D/dT \rfloor_E.$$

So in practice, a ferroelectric device is first poled in one direction, and then, with or without some bias field applied, the temperature is allowed to change. The charge released (or absorbed) constitutes an analogue signal of the amount of temperature change. And this measurement of the conventional pyroelectric effect persists to date, even though it doesn't describe the "stiffness" of the charge source, (i.e., the effective driving "impedance" for delivering that charge).

Described in this disclosure is an anomalous pyroelectric effect discovered in graded composition, i.e., dipole, ferroelectrics that yields an electric displacement with temperature much greater than the $\Delta P_r$ shown in FIG. 3, and, in fact, often many times larger than the entire hysteresis loop itself. In this sense, it is a thermal amplifier. This is accomplished by continuously cycling the ferroelectric from saturation to saturation at high frequency (e.g., 10 kHz), instead of merely poling it in one direction. Cycling at 1–15 kHz appears to be best. However, cycling as low as 100 Hz, or higher than 15 kHz, might provide the benefits of this invention.

Figure 4:
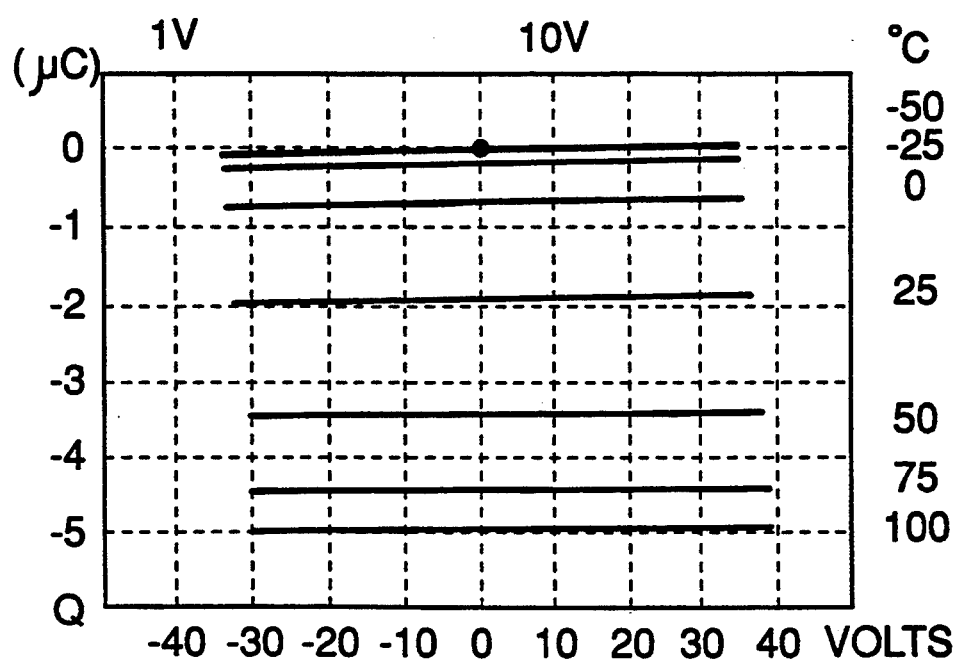
FIG. 4 shows an oscilloscope screen that indicates that charge changes with change in temperature.
Figure 6C:
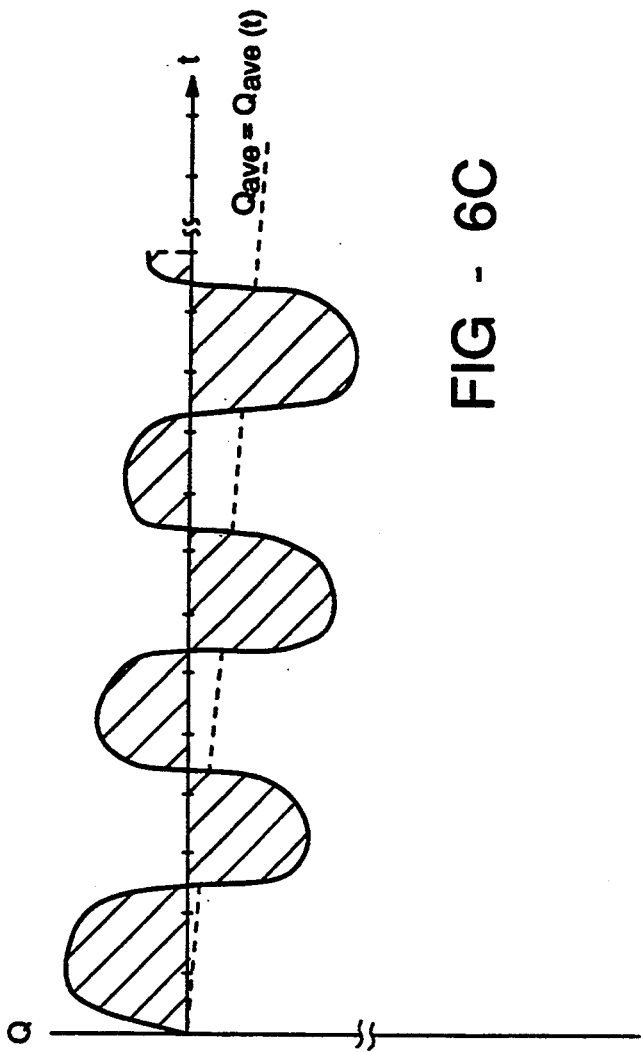
FIGS. 6a–6d diagramatically show a vertically skewed asymmetry in charge vs. voltage provided by this invention.
Figure 6D:
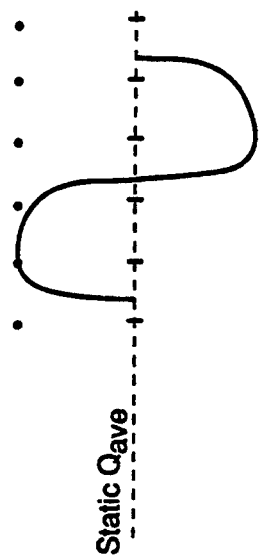
Figure 6A:
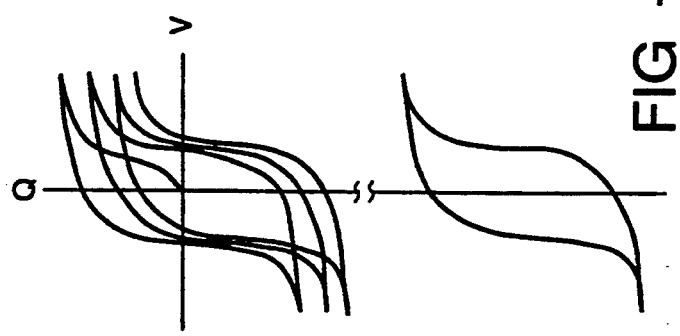
Figure 6B:
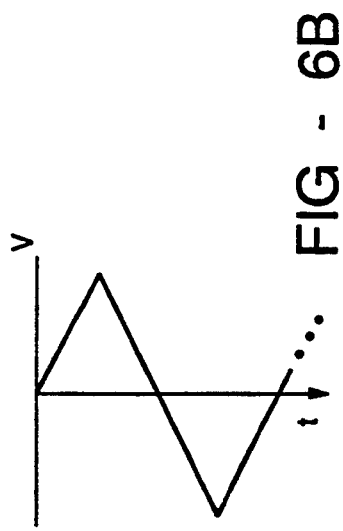

The continuous cycling of the asymmetrical hysteresis characteristic serves as a charge pump to accumulate some specific level of average charge for a given level of AC excitation. This level of average charge has been found to be a dramatic function of temperature as shown experimentally in FIG. 4. Here the 1 kHz AC excitation is held at a constant value of 34 volts peak (i.e., 68 volts peak to peak) along the x-axis. Each line is actually a stable hysteresis loop at one particular level of average charge along the y-axis. It appears that the DC offset of this hysteresis reverses if the ferroelectric element is reversed in the circuit. By this, we mean that the device is flipped 180° and reconnected in the circuit. In such instance, its electrodes are oppositely connected. This reversal in effect may prove to be quite useful.

At −50° C., the loop shows no displacement at all from the (0, 0) origin, shown by a bright dot. At −25° C., the average charge is $\cong -0.13$ $\mu$C. The temperature is changed in 25° C. increments and shows a pronounced effect about room temperature. FIG. 5 shows the effective pyroelectric coefficient in $\mu$C/cm2·K vs temperature for this KTN 14 $\mu$m MOD film driven at 1 kHz. The peak effective pyroelectric coefficient for this particular specimen at the particular excitation frequency and amplitude is approximately 5 $\mu$C/cm$^2$·K.

The conventional pyroelectric coefficient measured on this same specimen was 0.02 $\mu$C/cm$^2$·K. Therefore, by driving this film with AC, it becomes an active rather than just passive, device, with a gain factor of 5+0.02=250. Obviously, if gain can be obtained within the transducer device itself before amplification by subsequent electronics, the signal to noise ratio is improved as an ancillary, if not primary, benefit.

In our previously filed U.S. Ser. No. 07/533,213, we pointed out that we believed a bi-layer structure is preferred, in which one layer has small grains and another layer has large grains. We now believe that best results are obtained if an optimum grain size is used throughout the thickness of the film.

In general, all practical electrical or electronic solid state rectifiers are based upon the motion of free charge carriers in conductive media; albeit perhaps only semiconductive, but distinctly non-insulators. As such, they are all plagued with noises, such as: (1) thermal or Johnson noise, associated with random motion of free charge in resistive, (i.e., dissipative) media, (2) shot noise, due to discrete nature of free charge-type carriers, and (3) flicker, 1/f or surface noise, due to the generation and recombination of free carriers in random fashion.

In the hysteresis effect described hereinbefore in this patent application, we believe that it involves neither free charge carriers nor resistive media, but employs the electrical displacement of bound ionic charge in pure, but polar, dielectric insulators. Hence, some of the common noise sources are absent. Since bound charge cannot, in a practical way, demonstrate DC response (due to the resistivity-permittivity, $\rho\epsilon$, time constant of a real-world, less than perfect insulator and the ever-presence of some free charge), the immense 1/f noise at zero frequency is completely obviated, since the ferroelectric rectifier responds to AC only.

In fact, the concept of a ferroelectric rectifier allows tailoring the device for a specific bandpass to deliberately exclude unnecessary noise and extraneous signals. For example, the particular value of such bandpass rectification would serve as a detector for demodulating rf carrier signals, such as in superheterodyne receiver second detectors.

Lest it be erroneously assumed that the ferroelectric rectifier is restricted to low power level communication and intelligence-type signal circuitry, because the rectification mechanism occurs within a DC insulator, let it be known that the energy density of ferroelectric materials can challenge that of very strong ferromagnetic materials, such as an iron/neodymium rare earth magnet, such as commercially available under the trade name Magnaquench. Furthermore, since ferroelectrics, particularly in the film form, can be cycled at MHz and GHz rates, the power density during a switching transient can achieve the incredible levels of megawatts per cubic centimeter. Ferroelectrics are not cowardly materials and may yet prove to be the most noble of all. High power AC rectification, even at very high frequencies through the infrared and visible spectrum are potential industries.

The foregoing philosophical rationale has now been substantially reduced to practice by virtue of the new technology for forming ferroelectric films possessing a spontaneous polarization gradient through the film thickness, as hereinbefore described. A graded ferroelectric demonstrates a vertically skewed asymmetrical and unclosed hysteresis trajectory in its electrical displacement D vs electric field E plot upon initial excitation; or, for a practical capacitor-type geometry, in its charge Q vs voltage V plot as shown in FIG. 6. A given level of excitation leads to a steady state DC charge $Q_{ave}$, at which level the loop is closed and is substantially symmetrical.

Figure 7:
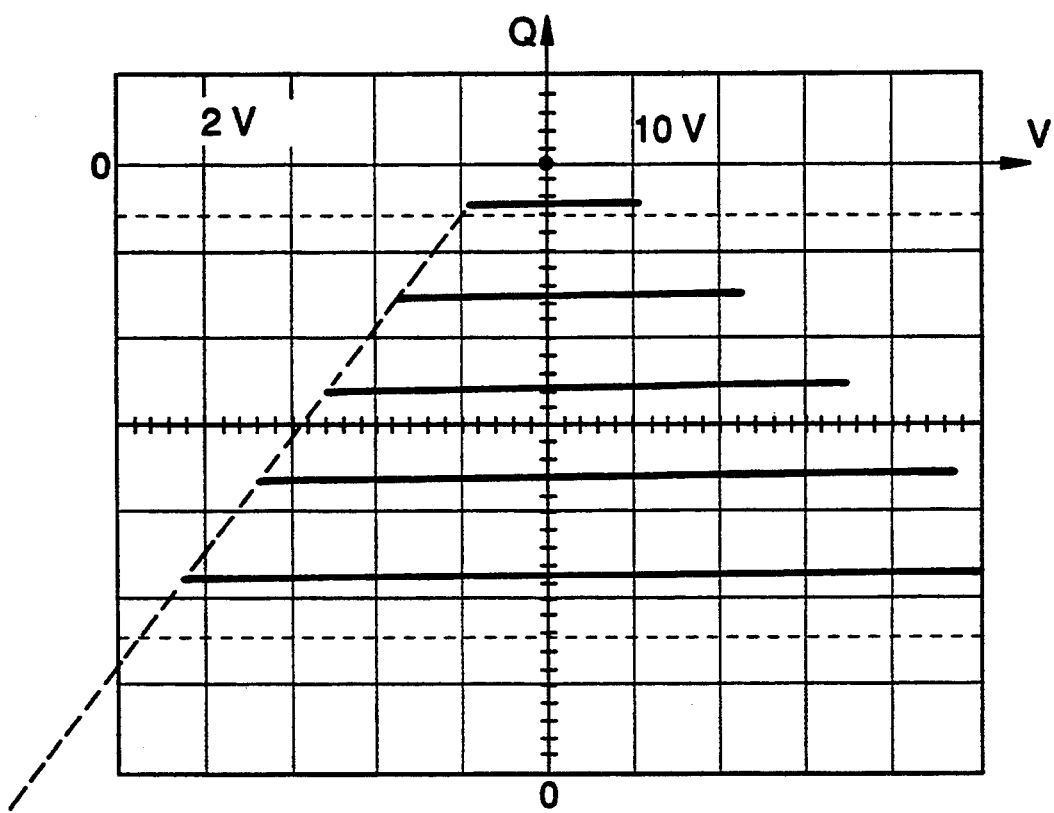
FIG. 7 shows an oscilloscope screen that indicates the function of our film as a ferroelectric rectifier.
Figure 8A:
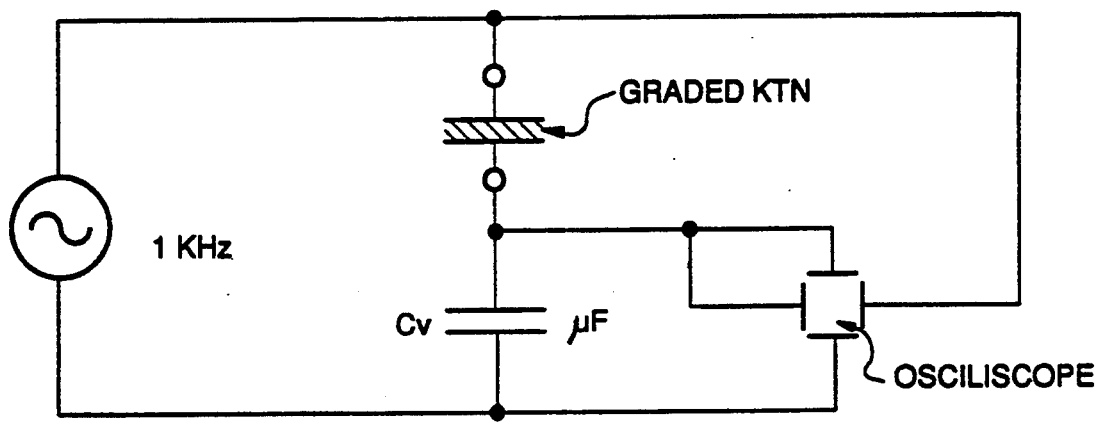
FIG. 8a shows a modified Sawyer-Tower electrical schematic for testing our film.
Figure 8B:
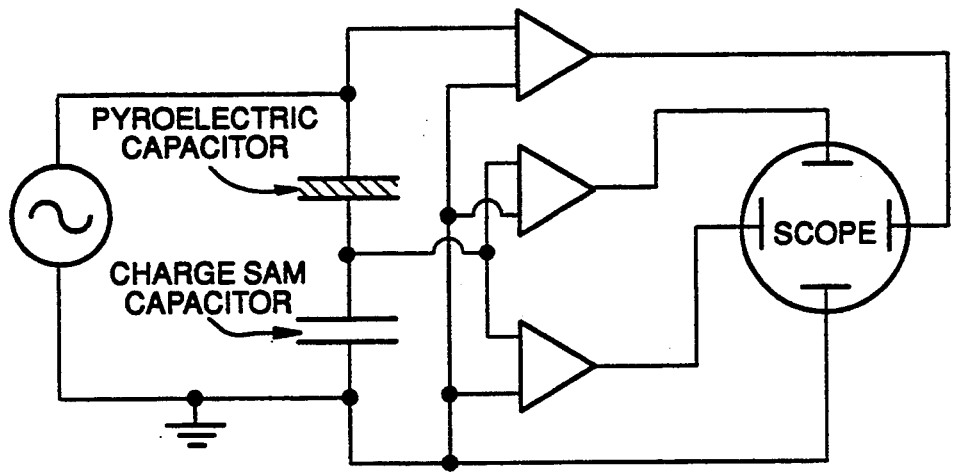
FIG. 8b shows another Sawyer-Tower circuit with differential inputs for hysteresis measurements.
Figure 8C:
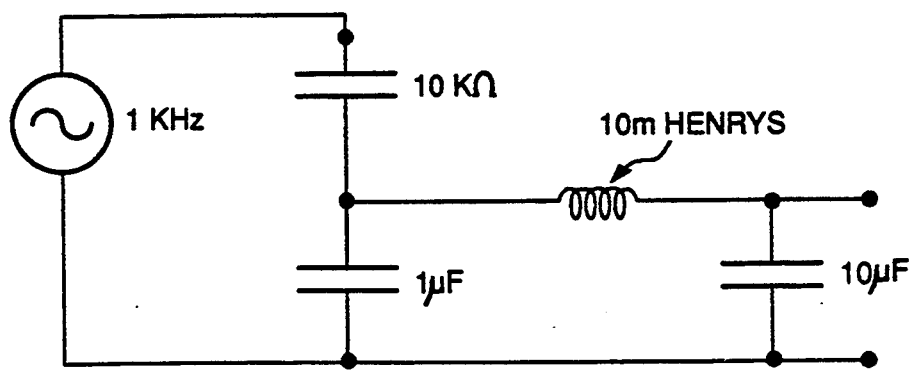
FIG. 8c shows an analogous circuit used to convert AC power to DC power.

The steady state static charge can be drawn upon to deliver work (energy) to a load, and has effectively converted AC energy to DC energy. On the other hand, a slight change in the amplitude of AC excitation causes a significant change in the static charge level as shown experimentally for a KTN 12 $\mu$m MOD film in FIG. 7. In FIG. 7, our special ferroelectric rectifier is excited at 1 kHz at about the x-axis and the steady state hysteresis loops, at the particular gain setting, for the various levels of excitation appear as horizontal lines representing the levels of average charge $Q_{ave}$. It can be seen that the charge out is essentially linear with the peak level of the 1 kHz excitation, and accordingly the device delivers charge directly proportional to the level of AC input as claimed. In such an arrangement, the oscilloscope provides a significant resistance in parallel with a 1 $\mu$F capacitor, as shown in FIGS. 8a and 8b. FIG. 8b shows a modified Sawyer-Tower circuit with differential inputs for hysteresis measurements. A 5 KHz sine wave at 1 mV$_{rms}$/$\mu$m was used as a test signal. FIG. 8c shows an analogous circuit in which DC outputs are provided, to release the charge stored on our ferroelectric capacitor by the AC voltage source.

FIGS. 8a and 8b each show a circuit that is essentially a Sawyer-Tower circuit, in which the oscilloscope is a very high impedance load in series between the low or zero impedance AC source and the graded ferroelectric device. FIG. 8c shows a modified Sawyer-Tower circuit, too. However, in this latter circuit, a load replaces the oscilloscope, and DC output terminals are provided at the extreme right end of the figure. Such a circuit can be considered as a rectifying circuit since AC energy is converted to DC energy in this type of circuit. By high impedance in a rectifying circuit, we mean the load might have an impedance of about 10 mega-Henrys. The AC source would have a frequency of about 1 KHz and would have an impedance of 0.1 ohm or less. For a 0.012 cm$^2$ ferroelectric electrode, device impedance would be about 10 kiloohms. The capacitor in parallel with the load would be about one microfarad.

In a rectifying circuit, the oscilloscope could be replaced by a 10 mega-Henrys load in series with a 10 microfarad capacitor, with terminals on opposite sides of the 10 microfarad capacitor. Other rectifying circuits, for utilizing the charge accumulation on the ferroelectric device, could be used, too.

Figure 9A:
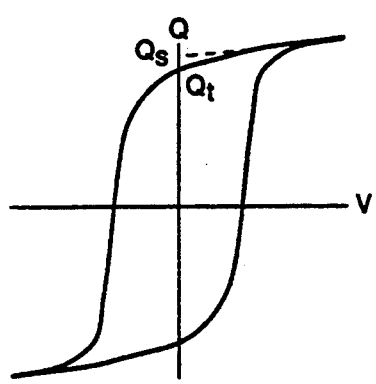
FIGS. 9a–9c diagramatically show a non-skewed symmetry for other ferroelectrics in charge vs. voltage.
Figure 9C:
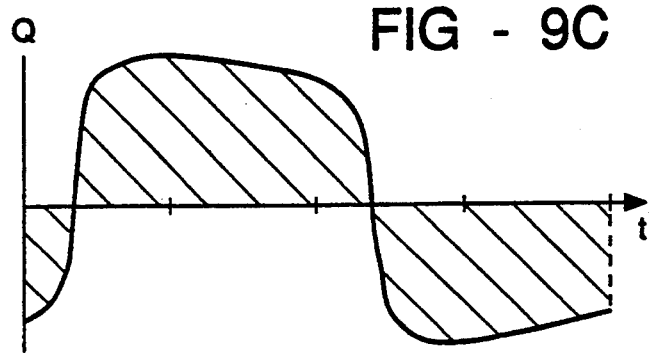
Figure 9B:
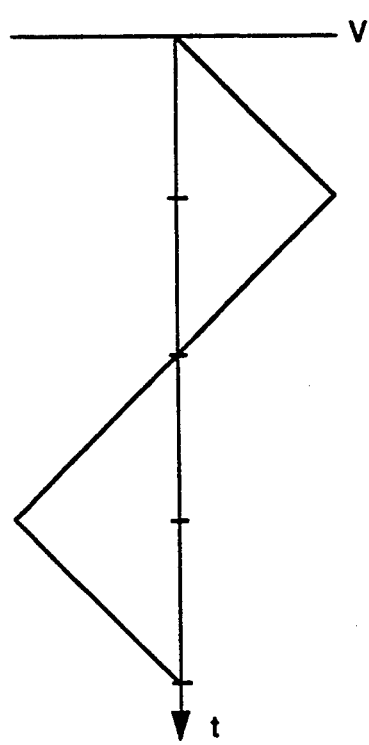

Ferroelectric materials are well known to possess nonlinear electrical characteristics, generally identified by evidence of hysteresis behaviors in plots of electric displacement D vs electric field E. In a specific, capacitor-type geometry, this characteristic is portrayed practically in a circuitous time-independent plot of charge Q vs voltage V, where V is generally a time-varying cyclical excitation, e.g., $V = V_{peak} \sin \omega t$. FIGS. 9a, 9b and 9c show such a portrait by the orthogonal reflection of Q(t) vs V(t), where V(t) for convenience is selected to be a simple triangular waveform.

Figure 10A:
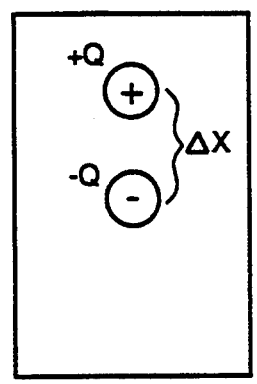
FIGS. 10a–10c show diagrams illustrating the reversible dipole moments of ferroelectrics.
Figure 10B:
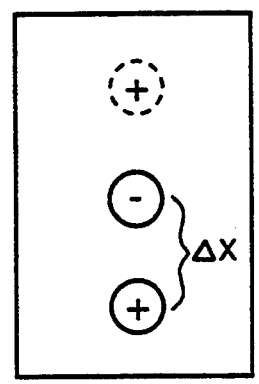
Figure 10C:
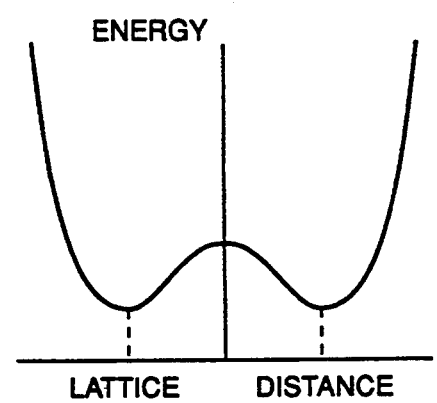

The ferroelectric hysteresis is a consequence of a reversible dipole moment, $Q \cdot \Delta x$, in the material; which on a macroscopic scale implies that the "center of gravity" of the negative charge system does not coincide with that of the positive charge system. This is shown symbolically in FIG. 10(a). The alternate stable state is shown in FIG. 10(b). The corresponding energy diagram is shown in FIG. 10(c). In ferroelectric materials, these charge systems represent bound charge associated with the ionic arrangement in the crystal cell, not to be confused with free charge in metallic-type conduction.

The magnitude of the surface charge density, of either the negative or positive charge system, in Coulombs/meter$^2$, is known as the spontaneous polarization $$P_s = Q_s/A, \quad (1)$$

See FIGS. 9a, 9b and 9c.

In a less than ideal ferroelectric, the surface charge density at zero applied field is the remnant polarization $$P_r = Q_r/A. \quad (2)$$

See FIGS. 9a, 9b and 9c.

Figure 11A:
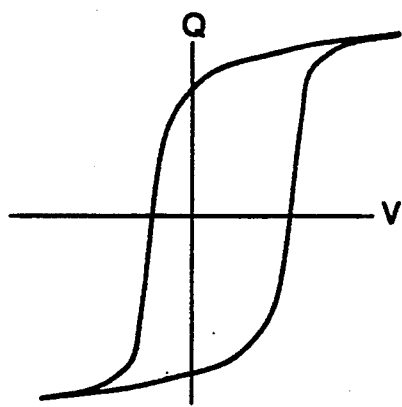
FIGS. 11a–11c show some previously known asymmetrical hysteresis loops.
Figure 11B:
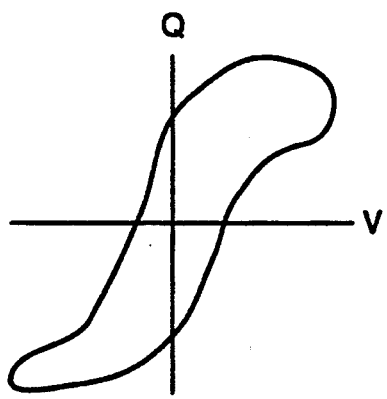
Figure 11C:
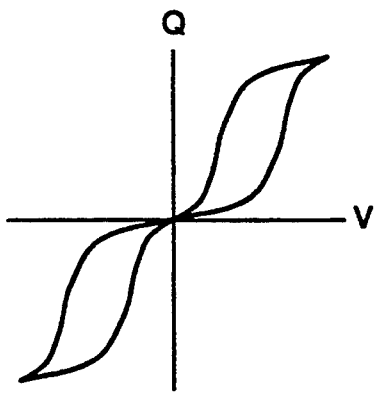

Some investigators in ferroelectric materials research have reported non-symmetrical ferroelectric hysteresis loops, generally involving some type of bias in the voltage or electric field, causing a lateral translation of the loop, such as shown in FIG. 11(a). Also, one of the difficulties in ferroelectrics work, particularly in thin layers or films, is the acquisition of ohmic, i.e., non-rectifying, contacts to form a capacitive structure, FIG. 11(b). Too, there have been reports on double hysteresis loops, as shown in FIG. 11(c), usually attributed to an antiferroelectric structure at near the Curie temperature that is driven to a ferroelectric state by the E-field.

Figure 12A:
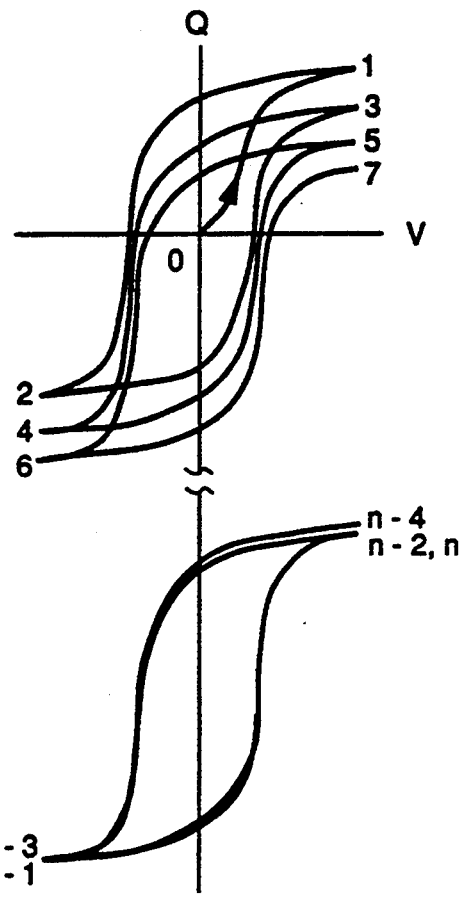
FIGS. 12a–12b show the kind of asymmetry in hysteresis loop characteristic of this invention.
Figure 12B:
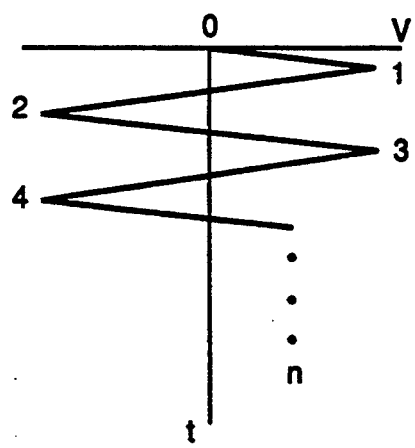

This particular disclosure is based upon a heretofore unreported ferroelectric hysteresis loop asymmetry with translation along the vertical axis, as shown in FIGS. 12a, 12b. Asymmetry of this type is attributed, at least in part, to a polarization gradient with distance beneath the surface, in the direction of the applied E-field. Here $|-P_r| \neq |+P_r|$, but that fact is not readily detectable by pulse testing because free charge, always present to some extent in a practical system, can maneuver to neutralize the charge at the surface. Thus, a DC voltage cannot be developed, or charge separation be measured.

Figure 13:
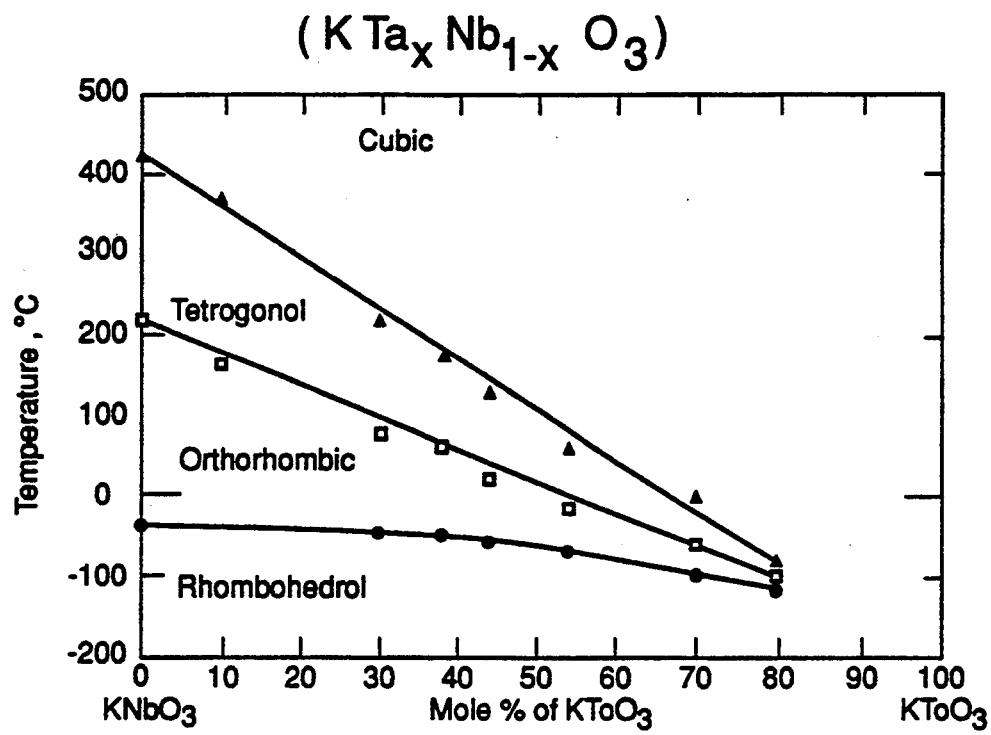
FIG. 13 shows a KTN phase diagram.

As hereinbefore described, one method of fabricating a capacitive structure with a polarization gradient in the medium is almost indigenous to the use of the multilayer metallo-organic-decomposition (MOD) process. This is especially true with respect to a compound ferroelectric such as potassium tantalate—potassium niobate (KTN), still more specifically $KTa_xNb_{1-x}O_3$. As shown in the phase diagram of FIG. 13, the Curie temperature $T_c$ for transition from the cubic (non-ferroelectric) state to the tetragonal (ferroelectric) state is clearly a predictable function of the molar ratio. Hence, if x in $KTa_xNb_{1-x}O_3$ is made to vary with depth into the dielectric medium, a gradient in $T_c$ would prevail.

Figure 14:
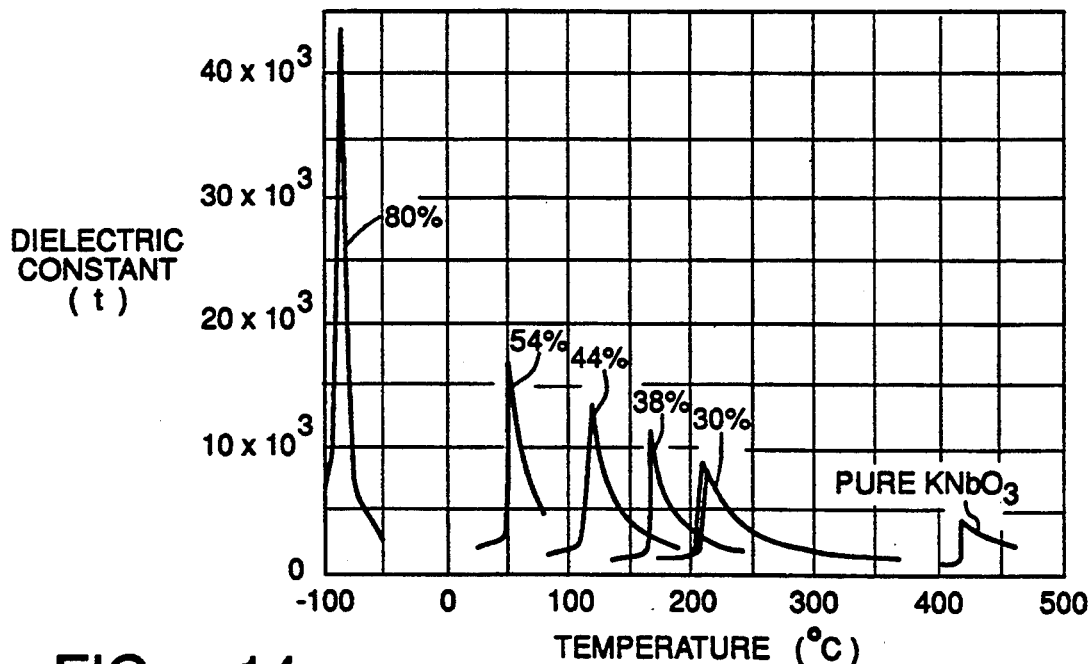
FIG. 14 shows a temperature vs. dielectric constant diagram for KTN based on differing mole fractions of $KTaO_3$.

The dielectric constant, or permittivity $\epsilon$, as a function of mole % of $KTaO_3$ is shown in FIG. 14. Since the permittivity in a ferroelectric is a function of temperature, $\epsilon = \epsilon(T)$, and is essentially equal to the rate of change of polarization with field, $\delta P/\delta E$, then it follows that $P = P(T)$. And, therefore, $$P(T) \propto \int \epsilon(T) dT. \quad (3)$$

Figure 15:
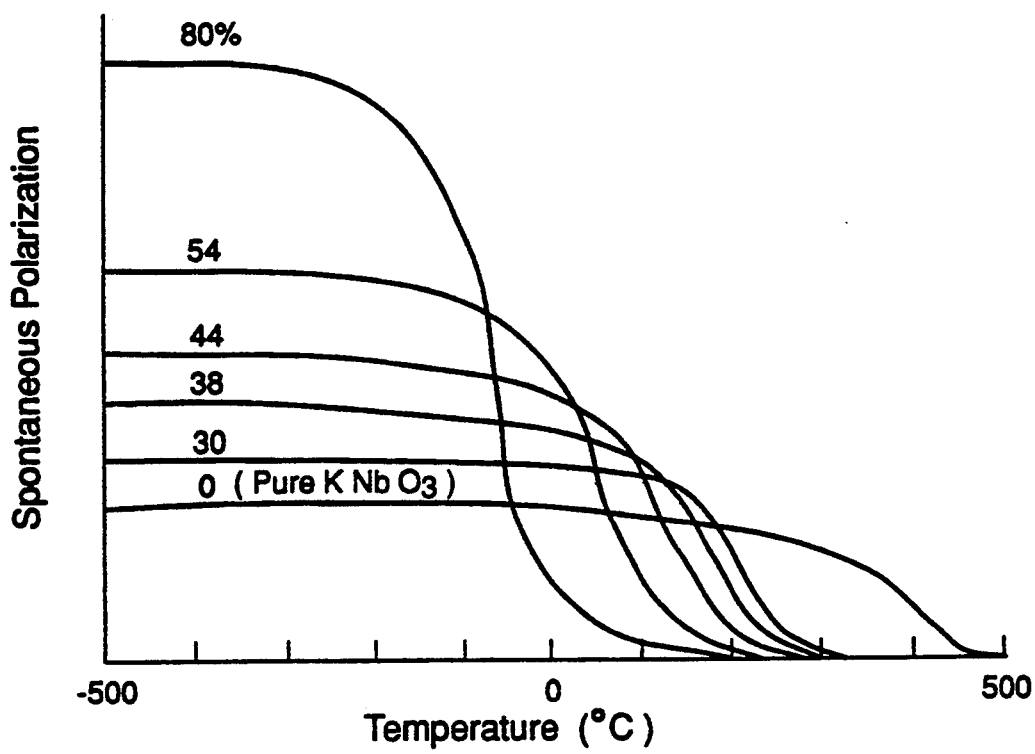
FIG. 15 shows a diagram illustrating variation in spontaneous polarization with mole percent $KNbO_3$ temperature.

Thus, the permittivity variation with mole % suggests a concomitant set of spontaneous polarization curves as shown in FIG. 15.

Figure 16:
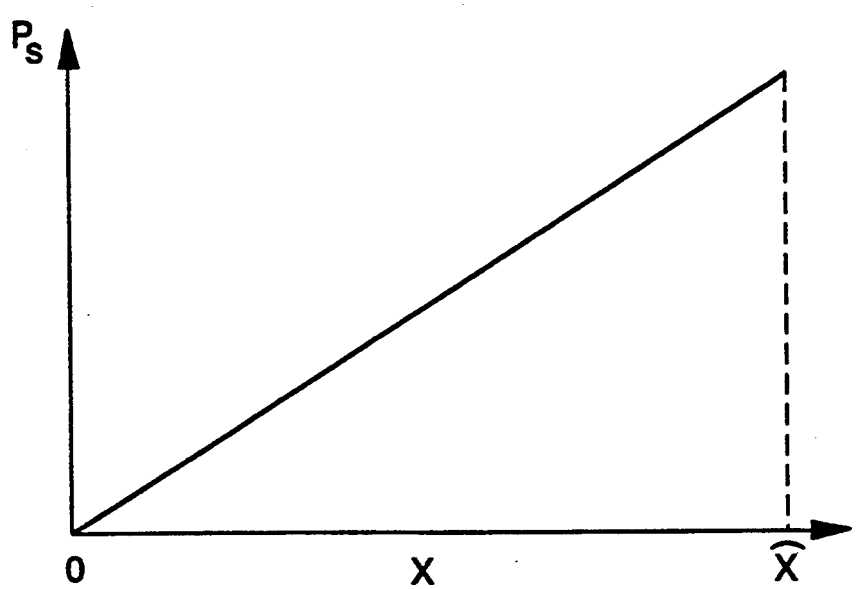
FIG. 16 shows a diagram illustrating the change in permittivity with increasing distance into a medium.

At any one temperature in FIG. 15 there can be a dramatic variation of $P_s$ with distance into the ferroelectric for the case of a varying mole % with distance. Assume for convenience the linear change of $P_s$ with distance x into the medium as shown in FIG. 16. Considering only bound charges due to spontaneous polarization, the Maxwell expression is $$\vec{\nabla} \cdot \vec{P}_s = \rho_{spv} \text{ (spontaneous polarization volume charge density).} \quad (4)$$

Since all variation is unidirectional, the expression reduces to $$\frac{\partial P_s}{\partial x} = \frac{dP_s}{dx} = \rho_{spv} \quad (5)$$

where $\rho_{spv}$ is necessarily a constant to preserve continuity of charge between unit cells.

The spontaneous dipole moment $p_s$ per unit volume $\Delta v$ at any point in the medium will derive from $$P_s \bigg|_{Q \, a \, point} = \lim_{\Delta v \to 0} \frac{p_s}{\Delta v} = \lim_{\Delta v \to 0} \frac{Q_s \Delta x}{\Delta v} \quad (6)$$

and from Equation (5)

$$= \rho_{spv} \int_0^x dx = \rho_{spv} \, x. \quad (7)$$

Comparing (6) and (7) clearly shows that the dipole moment arm $\Delta x$ is a function of x $$\Delta x = f(x), \quad (8)$$

which for the assumed linear distribution is $$\Delta x = \frac{(\rho_{spv} \Delta v)}{Q_s} x = x. \quad (9)$$

Now, since the dipole length $\Delta x$ is a function of x, the interesting conclusion is that effectively each unit cell on average must be asymmetric, as shown symbolically in FIG. 17(a). The hypothesized energy diagram is shown in FIG. 17(b). The summation of all unit cells in the series thus dictates an asymmetry of the hysteresis loop as promised in FIGS. 12a, 12b and 12c. Excitation of this unbalanced ferroelectric material, as shown in FIGS. 18a, 18b and 18c, leads to an unbalanced charge vs time, Q(t), characteristic waveform, that ultimately reaches a static value of $Q_{ave}$, at which point the hysteresis loop closes on itself.

This phenomenon is experimentally revealed in FIG. 19. The specimen is a 12 μm KTN MOD film on an yttria, $Y_2O_3$, substrate with a platinum flash to serve as a bottom electrode. The top electrode is Titanium-Nickel with an area of 0.01026 cm$^2$.

Figure 20:
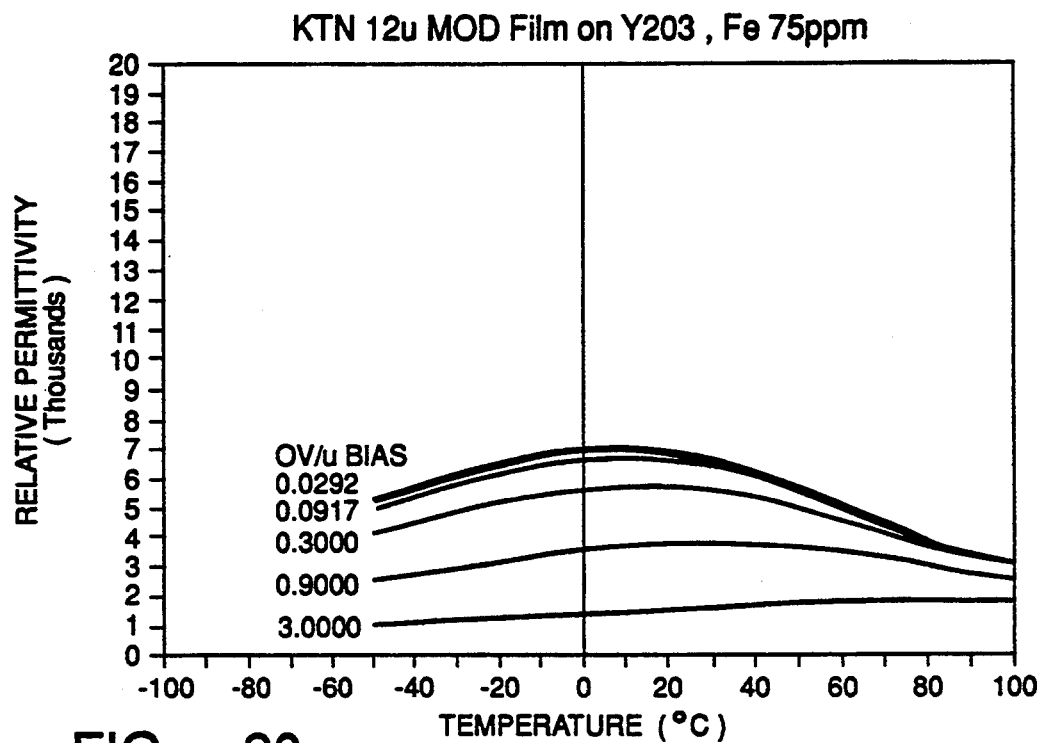
FIG. 20 shows a plot of change in permittivity of our improved KTN film with temperature at several different biases.
Figure 21:
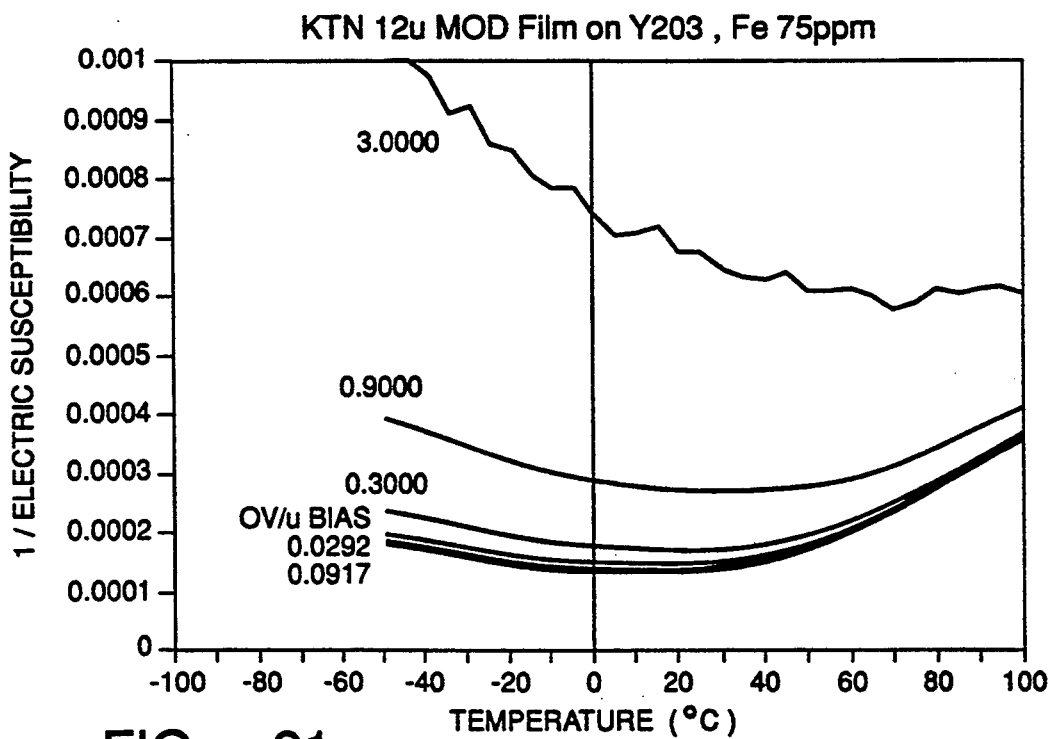
FIG. 21 shows a plot of change in susceptibility of our improved KTN film with temperature at several different biases.
Figure 22A:
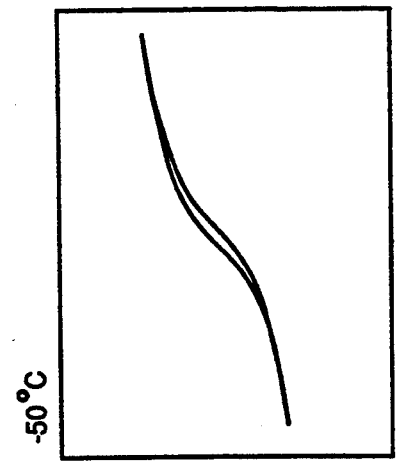
FIGS. 22a–22f show oscilloscope displays that demonstrate the presence of spontaneous polarization at temperatures up to 100° C.
Figure 22B:
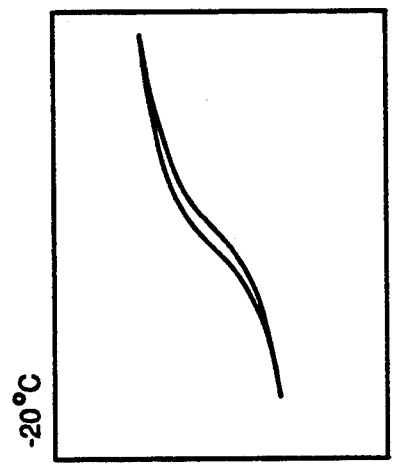
Figure 22C:
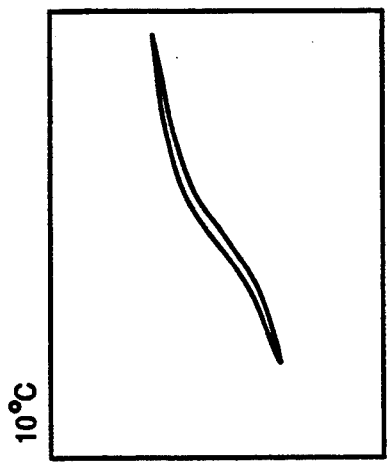
Figure 22D:
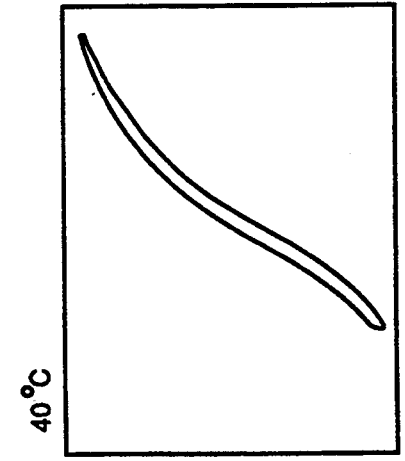
Figure 22E:
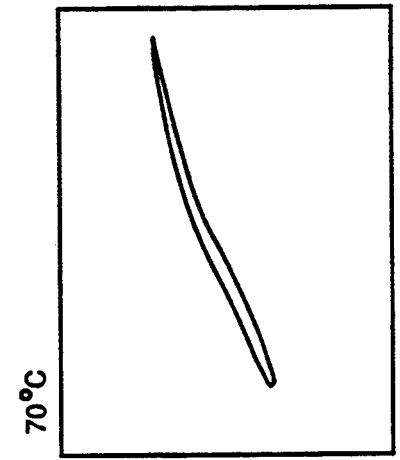
Figure 22F:
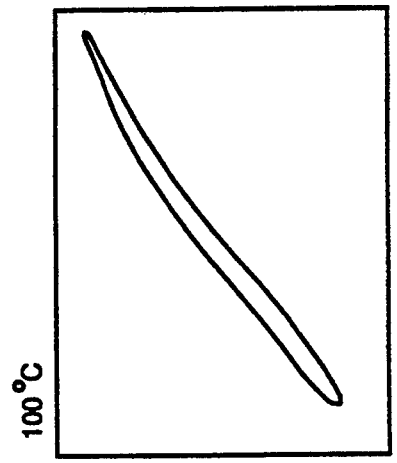

The relative permittivity with temperature and at several DC bias fields is shown in FIG. 20. The absence of a clear peak, so typical of ferroelectric perovskite structures at Curie temperature, suggests a distribution of such Curie temperatures. Furthermore, the inverse susceptibility vs temperature curve of FIG. 21 does not show a clear Curie-Weiss decay characteristic, which also is not typical of classical perovskites.

Finally, the steady state hysteresis loops shown in FIGS. 22a–22f demonstrate the presence of spontaneous polarization yet at 100° C., which is well past the permittivity peak and clearly uncharacteristic of conventional ferroelectric perovskites.

The foregoing unbalanced capacitive switch is an entirely new, hitherto unknown or even imagined, electrical circuit element that delivers an unbalanced charge waveform for a symmetrical cyclic excitation. Numerous practical applications will certainly evolve as the science of nonlinear dielectrics develops. The concepts of dielectric amplifiers, which were analog copies of magnetic amplifiers, as well as mag. amps, themselves, have both been shelved for many years following the semiconductor industry explosion. But all semiconductors involve charge flow per unit time (i.e., current) in resistive (i.e., lossy and noisy) media. One can predict that a whole new area of dielectrical engineering will emerge where active as well as passive dielectric elements will serve for logic, control, amplification, transduction, etc., by the switching of bound charge, instead of the limited Ohm's Law science of free charge flow in resistors. Another application may well be the use as an analog computer to simulate similar mechanical behaviors, such as unbalance friction on an inclined plane.

Furthermore, now that this dielectric phenomenon has been demonstrated, one can immediately hypothesize and claim from the Duality Principle in electromagnetics, an equivalent effect in ferromagnetic materials with graded magnetization.

Accordingly, we claim as part of our invention all devices that employ the concept of graded materials that lead to vertically displaced hysteresis loops.

The polarization gradient ferroelectric phenomenon is not limited to, but is most readily demonstrated in film thicknesses in the order of 10 μm using the multi-layer MOD process. The 10 μm region is an emerging technology intermediate to the thick film and thin film sciences, and is receptive to the fabrication of graded layers.

In the MOD process, each layer is achieved by (1) depositing an ink containing the desired film material, e.g., KTN, onto a substrate, which (2) is spun to thinly and uniformly spread the ink on the surface, followed by (3) immediate pyrolyzation in an oven having an air atmosphere. Subsequent layers are formed in an equivalent manner, but each subsequent layer sees one less pyrolyzation than the preceding one. Finally, in practice, when all layers are deposited (e.g., 20 to 50 layers to achieve 10 μm thickness in instances where each individual layer is very thin), the composite structure is heat treated and simultaneously exposed to excess potassium vapor to more than just replenish potassium that might be lost in the heat treating process. Furthermore, the substrate, e.g., yttria, can conceivably act as a potassium sink. If so, with a potassium source on one side and a sink on the other, together with the inherent difference in history of each layer, a significant polarization gradient can be achieved. In such instance, the KTN film does not just have a surface gradient of potassium content, with the balance of the film being at a constant stoichiometric potassium content. Potassium concentration would also be graded (at a lower potassium level) at the backside of the film. The middle thickness of the film thus may or may not have a remainder that is constant in potassium content, depending on the thickness of the film, how it is annealed, etc. It is even possible that a substantially continuous but not necessarily constant gradient through the thickness of the film might even be preferred. Other techniques of achieving polarization grading will be obvious to those skilled in the art.

It was hereinbefore pointed out that a linear relation exists between the DC charge out and the AC voltage in, in our graded potassium, i.e., graded Curie temperature or graded dipole moment, device.

However, ferroelectric materials can be tailored to control the temperature at which the Curie anomaly occurs and, thus, the temperature of operation can be selected for specific electrical characteristics. As indicated above, the spontaneous polarization profile with depth into the film can be designed to emphasize specific electrical behaviors.

A linear rectifier has use, for example, as a second detector in a superheterodyne receiver, wherein the modulated i.f. waveform is detected to recover the audio modulation. In the first detector of such a radio receiver, the detector beats the modulated r.f. from the antenna with a fixed frequency local oscillator to generate a modulated i.f. Thus, the first detector must possess a multiplying function to form the difference frequency (i.e., i.f.) between the r.f. carrier and the local oscillator. This is accomplished in practice by the use of a nonlinear detector, preferably a square-law detector.

Figure 23:
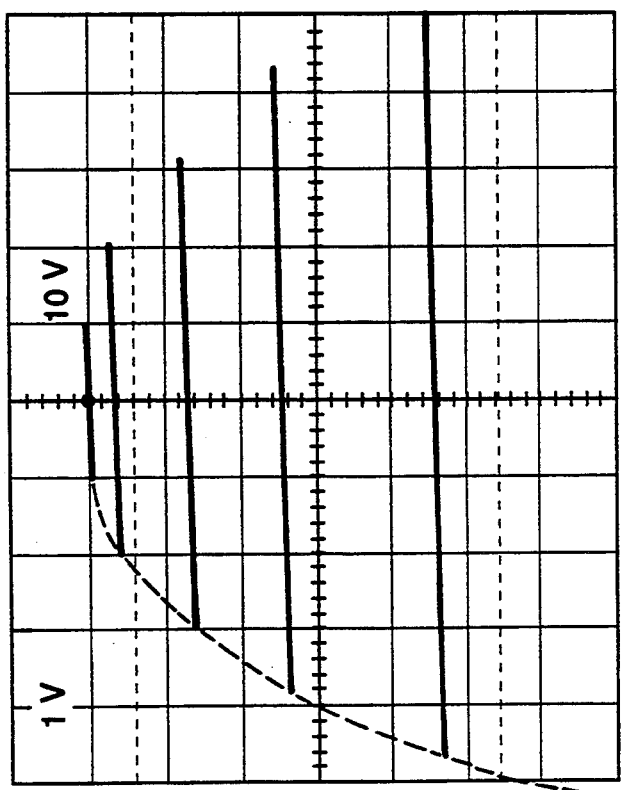

FIG. 23 is the characteristic DC charge out vs AC voltage in, for a KTN 12 μm MOD film. Here such a square-law electrical characteristic is clearly demonstrated.

Figure 24B:
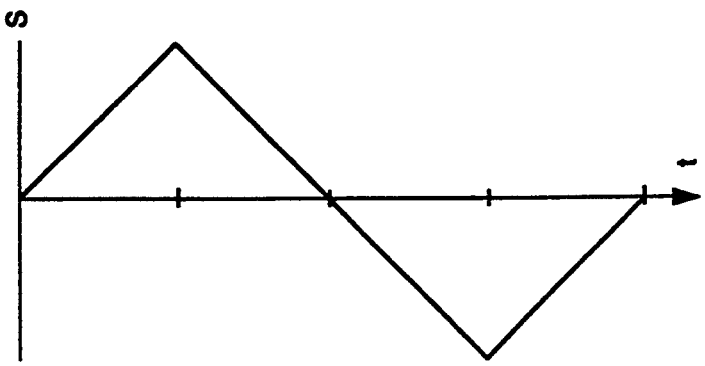
FIGS. 24a–24c diagramatically show a traditional vertical asymmetry in charge vs. voltage for hysteretic systems.
Figure 24C:
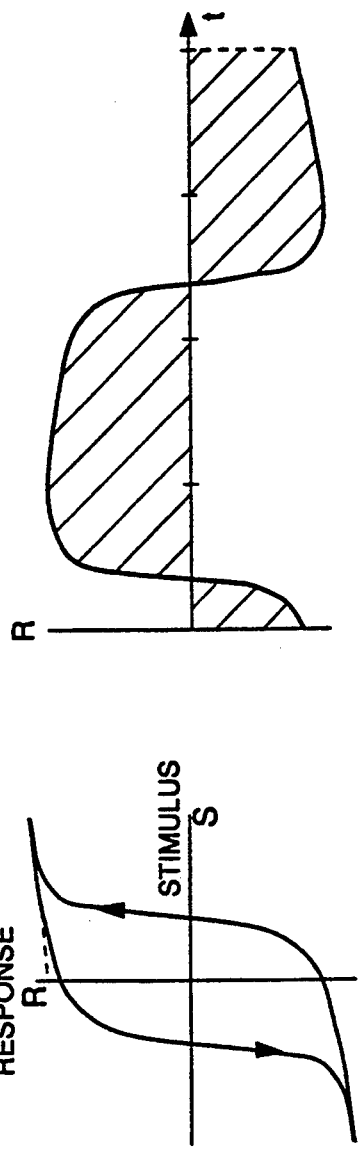
Figure 24A:
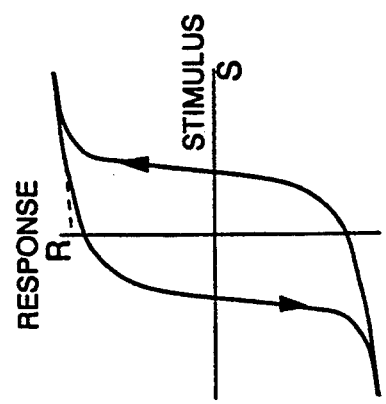

Hysteresis can be defined generally as a retardation of some effect on a system when the forces acting upon the system are altered in some way. In a cyclical hysteretic system, not only does the response lag the stimuli, but the system tolerates reversal of the sense of the stimuli, in order to return the system to its original state. Thus, in spite of the linear irreversibility due to hysteresis lag, the nonlinear process can, by circuitous path, close on itself, as shown typically in FIGS. 24a, 24b and 24c.

In an asymmetrical hysteretic system, even though the sense of the stimulus can be reversed, the system does not quite return to its original state. Instead, the response accumulates in one direction to some static value, although the excitation itself is symmetrical. Such asymmetry of response is attributable to a gradient in the system. An example of this asymmetrical behavior is shown in the earlier described FIGS. 6a, 6b and 6c.

Figure 25A:
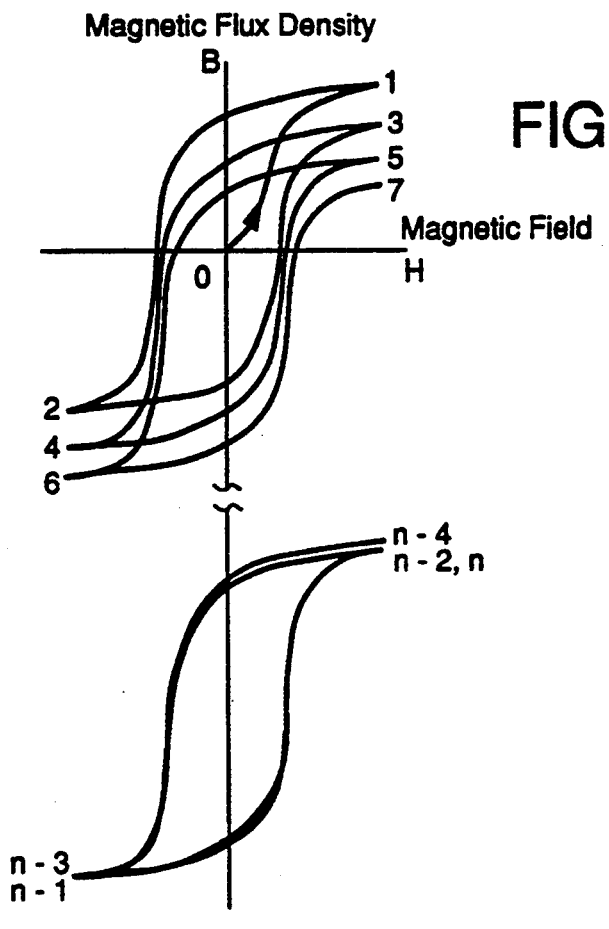
FIGS. 25a–25b diagramatically show a vertically skewed asymmetry in hysteresis provided by this invention.
Figure 25B:
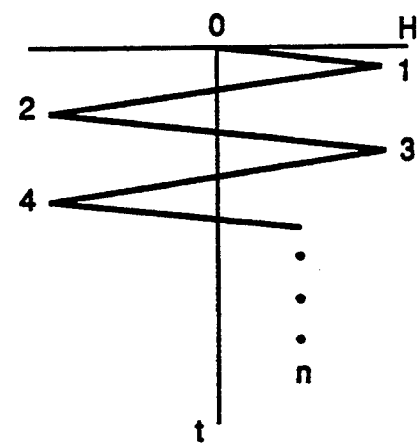

By virtue of the Duality Principle in the science of electromagnetics, whereby magnetic and dielectric systems differ only by the interchange of electric E and magnetic H fields, the equivalent ferromagnetic asymmetrical hysteresis can be hypothesized and is shown in FIGS. 25a and 25b. Here a gradient in spontaneous magnetization of a composite ferromagnetic arises, for example, from a gradient in Curie temperatures throughout the medium, or by any other fabrication scheme that grades the magnetic dipole moment. This is analogous to the gradient in electric dipole moment in the ferroelectric case as hereinbefore described. Compare FIGS. 25a and 25b with FIGS. 12a and 12b.

Figure 26:
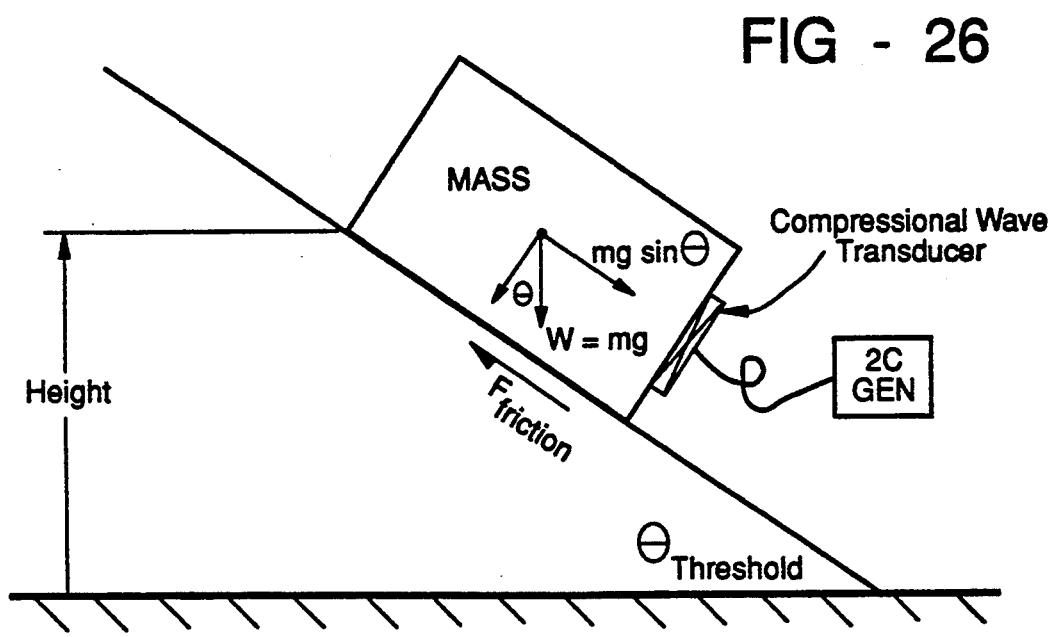
FIG. 26 shows a diagram in which the principles of this invention are also applied to mechanical systems.

The concept of a static accumulation of effect for a dynamic cyclical stimulus is somewhat akin to the mechanical case of a mass positioned on an inclined plane tilted to the angle where the coefficient of friction force is at the threshold of slip ($F_{friction} = mg \sin \theta$ threshold) as shown in FIG. 26. A mechanical wave motion, e.g., by ultrasonic transducer, delivers a cyclical perturbing force to the mass, to dither the system. When the time-varying force is in a direction to oppose the frictional force, the mass moves minutely during each half-cycle until the mass settles to equilibrium at the bottom of the plane. The gradient in this mechanical system exists in the inherent nonlinearity of the coefficient of friction, i.e., static friction exceeds sliding (dynamic) friction.

Most importantly, the potential energy released by the descent of the mass can be many times that of the energy of the compressional wave used to release that energy. Thus, there is an apparent gain factor in the system, although energy is needed to be stored in the system to start with. In fact, all hysteretic systems must have the characteristic of storing something, preferably internal energy. The cyclical asymmetric hysteretic systems allow the apparent extraction of some of this energy by a cyclical excitation of the system.

We hereby claim as new deliberately introducing a gradient into a system for the purpose of achieving an asymmetric hysteresis behavior, in order to achieve some type of static response to a symmetrical, cyclical stimulus. Obviously, such systems are not restricted to be only dielectrical or magnetic in nature, but can also be thermal, optical, sonic, mechanical, chemical, nuclear, etc., depending upon the avowed purpose, provided that each is amenable to graded structuring.

The embodiments of the invention in which an exclusive property or privilege is claimed are defined as follows:

1. A transducer comprising:
    a ferroelectric device that includes a thin film of ferroelectric material;
    an electrical contact on each face of said film of ferroelectric material; and
    a graded dipole moment in a direction of the thickness of the film that is at least adjacent one of the faces,
    effective to produce a charge increase on opposite faces of the film when a constant AC voltage is applied to those opposite faces and additional energy is imparted to the film.

2. The transducer of claim 1 in which the additional energy imparted to the film is heat energy.

3. The transducer of claim 1 in which the additional energy imparted to the film is radiant energy.

4. The transducer of claim 1 in which the ferroelectric material is potassium tantalate niobate.

5. The transducer of claim 1 in which the ferroelectric material is polycrystalline potassium tantalate niobate, the graded dipole moment is produced by a gradient in potassium composition, and the additional energy imparted to the film is radiant heat energy.

6. An infrared detector comprising:
    a ferroelectric film;
    an electrical contact on each of two opposed faces of said ferroelectric film; and
    a graded dipole moment in said ferroelectric film adjacent to and perpendicular to one of the faces.

7. An infrared detector comprising:
    a thin film of ferroelectric material;
    a thin film electrical contact on each face of said film of ferroelectric material; and
    a graded composition in a direction of the thickness of the film that is adjacent a face of the film,
    effective to produce a film having a hysteresis loop with a DC offset that is a measure of infrared energy applied to the film.

8. The infrared detector of claim 7 wherein the thin film of ferroelectric material is a polycrystalline film of potassium tantalate niobate that is about 5–20 micrometers thick.

9. The infrared detector of claim 8 wherein the graded composition in the ferroelectric film is due to a gradient in potassium concentration in said film.

10. An infrared detector comprising:
    a thin film of ferroelectric potassium tantalate niobate;
    an ordered array of thin film electrical contacts on a face of said film, said contact array providing pixel sites for a reconfigurable display;
    said film having a graded composition at said pixel sites; and
    said graded composition being in a direction of the thickness of the film,
    effective to allow each site to exhibit a distinctive AC hysteresis loop that is representative of infrared radiation applied to that site.

11. The infrared detector of claim 10 wherein:
    the thin film of potassium tantalate niobate is polycrystalline;
    crystals in the film are monocrystalline potassium tantalate niobate grains having an average dimension at least about ferroelectric domain size and less than about two-thirds the thickness of the film;
    the film is thick enough to be continuous and self-supporting but thin enough to exhibit changes in pyroelectric effect at said pixel sites in response to incident infrared radiation; and
    the film is physically supported on and electrically connected to a silicon integrated circuit by means of an array of electrical contacts on said silicon integrated circuit that is complementary to the array of electrical contacts on said film.

12. An infrared detector comprising:
    a thin film of ferroelectric potassium tantalate niobate;
    an ordered array of thin film electrical contacts on a face of said film, said thin film contacts substantially transmissive to incident infrared radiation,
    said contact array providing pixel sites for a reconfigurable infrared display; and
    a graded composition in said film adjacent a surface of said film at said pixel sites, said graded composition being in a direction of the thickness of the film,
    effective to allow each pixel site to exhibit a discrete AC hysteresis loop that has its own DC offset that is a measure of infrared radiation illuminating that particular pixel site.

13. The infrared detector of claim 12 wherein:
    the thin film of potassium tantalate niobate is polycrystalline;

the film comprises monocrystalline grains of potassium tantalate niobate having a minimum dimension at least about ferroelectric domain size and a maximum dimension less than about two-thirds the thickness of the film;

the film is about 5 micrometers to 30 micrometers thick; and the array of electrical contacts on the film is bonded and electrically connected to a complementary array of electrical contacts on a silicon integrated circuit, effective to dispose a radiation incident surface of said film in a plane for receiving infrared radiation.

14. A film having increased sensitivity to radiation due to the presence of a gradation in pyroelectric effect extending between a major surface of the film and an inner region of the film, said film comprising:

a body portion having a given stoichiometry and associated pyroelectric effect substantially throughout its area and thickness;

a surface portion on said body portion, said surface portion having a thickness, an external major surface, an internal major surface, and an interface between said internal surface and said body portion; and a gradient in Curie temperature through the surface portion thickness, effective to provide a gradation in pyroelectric effect between the major external surface of the surface portion and said interface that enhances sensitivity of the film to radiation.

15. The film of claim 14 in which the film is selected from the group of materials consisting of potassium tantalum niobate, barium strontium titanate, and lanthanum-doped lead zirconate titanate.

16. A film having increased sensitivity to radiation due to the presence of a gradation in pyroelectric effect extending from a lower level at an inner region of the film to a higher level at a surface of the film that is to be exposed to radiation, said film comprising:

a body portion of a material having a given stoichiometry and associated pyroelectric effect substantially throughout its area and thickness;

a surface portion of said same material on said body portion, said surface portion having a thickness, an external major surface, an internal major surface, and an interface between said internal surface and said body portion; and a gradient in Curie temperature through the surface portion thickness from a lower temperature at said internal surface to a higher temperature at said external surface, effective to provide an analogous gradation in pyroelectric effect between the internal and external surfaces that enhances sensitivity of the film to radiation.

17. The film of claim 16 in which the film material is selected from the group consisting of potassium tantalum niobate, barium strontium titanate, and lanthanum-doped lead zirconate titanate.

18. A potassium tantalum niobate film having increased sensitivity to infrared radiation due to the presence of a gradation in pyroelectric effect extending from a lower level at an inner region of the film to a higher level at a surface of the film that is to be exposed to infrared radiation, said film comprising:

a body portion having a given potassium tantalum niobate stoichiometry and associated pyroelectric effect substantially throughout its area and thickness;

a potassium tantalum niobate surface portion on said potassium tantalum niobate body portion, said potassium tantalum niobate surface portion having a thickness, an external major surface for exposure to infrared radiation, an internal major surface, and an interface between said internal surface and said body portion; and a gradient in Curie temperature in said potassium tantalum niobate surface portion that is perpendicular to its external surface and decreases with increasing distance below said external surface, effective to provide an enhancement in pyroelectric effect enhances sensitivity of the film to infrared radiation.

19. A potassium tantalum niobate film having increased sensitivity to infrared radiation due to the presence of a gradient in potassium concentration in a surface portion of the film, which gradient has a lower proportion of potassium at an inner portion of the film and a higher proportion at an external surface, which surface is to be exposed to infrared radiation, said film comprising:

a body portion having a given potassium tantalum niobate stoichiometry and associated given pyroelectric effect substantially throughout its area and thickness;

a potassium tantalum niobate surface portion on said potassium tantalum niobate body portion, said potassium tantalum niobate surface portion having a thickness, an external major surface for exposure to infrared radiation, an internal major surface, and an interface between said internal surface and said body portion; and a gradient in potassium in said potassium tantalum niobate surface portion that is perpendicular to its external surface and decreases with increasing distance below said external surface to a potassium concentration equal to that of said body portion, effective to provide an enhancement in pyroelectric effect, over that due to a constant potassium concentration in said surface portion that is equal to said body portion potassium concentration, that enhances sensitivity of the film to infrared radiation.

20. A pyroelectric detector comprising:

a pyroelectric film having opposed major faces;

successive planes in the thickness of the film adjacent and parallel to one of said faces; and each of said planes having progressively lower Curie temperature with increasing distance below said face, effective to cause said film to exhibit an asymmetric hysteresis upon application of an AC voltage of 1–15 KHz.

21. The pyroelectric detector of claim 20 wherein the group of planes has an innermost plane, and the innermost plane is in contact with a significant interior thickness of the film that has a substantially constant Curie temperature lower than the Curie temperature of said innermost plane.

22. A pyroelectric detector comprising:

a pyroelectric film having opposed parallel major faces;

a first group of successive planes in the thickness of the film adjacent to and parallel with one of said faces;

each of said planes in said first group, except for the outermost and innermost planes in said first group, having a Curie temperature that is lower than the Curie temperature of its neighboring plane that is closer to said one surface and that is higher than its neighboring plane that is further from said surface, the outermost and innermost planes of said group, respectively, having the highest and lowest Curie temperatures of said first group;

a second group of successive planes in the thickness of the film adjacent to and parallel with the other of said faces; and each of said planes in said second group, except for the outermost planes in said second group, having a Curie temperature that is higher than the Curie temperature of its neighboring plane that is closer to said other surface and that is lower than its neighboring plane that is further from said other surface, the innermost and outermost planes of said second group, respectively, having the highest and lowest Curie temperatures of said second group;

effective to cause said film to exhibit an asymmetric hysteresis upon application of an AC voltage of 1–15 KHz.

23. The pyroelectric detector of claim 22 wherein said first and second groups of planes are separated by a film thickness having a substantially constant Curie temperature that is lower than any Curie temperature in the first group of planes and higher than the Curie temperature in the second group of planes.

24. An infrared detector comprising:
a continuous polycrystalline film having two substantially parallel opposed faces and a composition exhibiting a pyroelectric effect at an acceptable non-cryogenic temperature, said film having a thickness of about 5–30 micrometers;
a crystal grain size in said film of a dimension from at least ferroelectric domain size for said composition up to about 50 percent of the thickness of the film;
an array of pixel electrodes on one of two opposed faces of continuous polycrystalline film; and
a complementary array of pixel electrodes on the opposite face of the film.

25. The infrared detector of claim 24 in which the film has a thickness of about 5–15 micrometers.

26. The infrared detector of claim 24 in which the film has a thickness of about 5–15 micrometers, and the film is supported on an integrated circuit.

27. The infrared detector of claim 26 in which the film has a composition selected from the class of KTN, BST, and modified PZT.

28. The infrared detector of claim 27 in which the film composition is KTN.

29. The infrared detector of claim 27 in which the film composition is BST.

30. The infrared detector of claim 27 in which the film composition is modified PZT.

* * * * *